US009190298B2

(12) United States Patent
Harada et al.

(10) Patent No.: US 9,190,298 B2
(45) Date of Patent: Nov. 17, 2015

(54) FILM FORMING METHOD AND RECORDING MEDIUM FOR PERFORMING THE METHOD

(71) Applicant: HITACHI KOKUSAI ELECTRIC INC., Tokyo (JP)

(72) Inventors: Katsuyoshi Harada, Toyama (JP); Yoshiro Hirose, Toyama (JP); Tsukasa Kamakura, Toyama (JP); Atsushi Sano, Toyama (JP); Yugo Orihashi, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/195,444

(22) Filed: Mar. 3, 2014

(65) Prior Publication Data
US 2014/0256156 A1 Sep. 11, 2014

(30) Foreign Application Priority Data
Mar. 5, 2013 (JP) .................. 2013-043539

(51) Int. Cl.
H01L 21/67 (2006.01)
H01L 21/3205 (2006.01)
C23C 16/02 (2006.01)
C23C 16/24 (2006.01)
C23C 16/44 (2006.01)
C23C 16/455 (2006.01)

(52) U.S. Cl.
CPC ...... *H01L 21/67017* (2013.01); *C23C 16/0272* (2013.01); *C23C 16/24* (2013.01); *C23C 16/4408* (2013.01); *C23C 16/45523* (2013.01); *H01L 21/32055* (2013.01)

(58) Field of Classification Search
None
See application file for complete search history.

(56) References Cited

U.S. PATENT DOCUMENTS 8,298,628 B2 * 10/2012 Yang et al. ............. 427/579
2011/0263105 A1 10/2011 Hasebe et al.

FOREIGN PATENT DOCUMENTS

JP 2011-249764 A 12/2011
WO 2011/123792 A2 10/2011

* cited by examiner

*Primary Examiner* — Scott B Geyer
(74) *Attorney, Agent, or Firm* — Volpe and Koenig, P.C.

(57) ABSTRACT

A method of manufacturing a semiconductor device is provided. The method includes treating a surface of an insulating film formed on a substrate by supplying a first precursor including a predetermined element and a halogen group to the substrate, and forming a thin film including the predetermined element on the treated surface of the insulating film by performing a cycle a predetermined number of times. The cycle includes supplying a second precursor including the predetermined element and the halogen group to the substrate, and supplying a third precursor to the substrate.

16 Claims, 9 Drawing Sheets

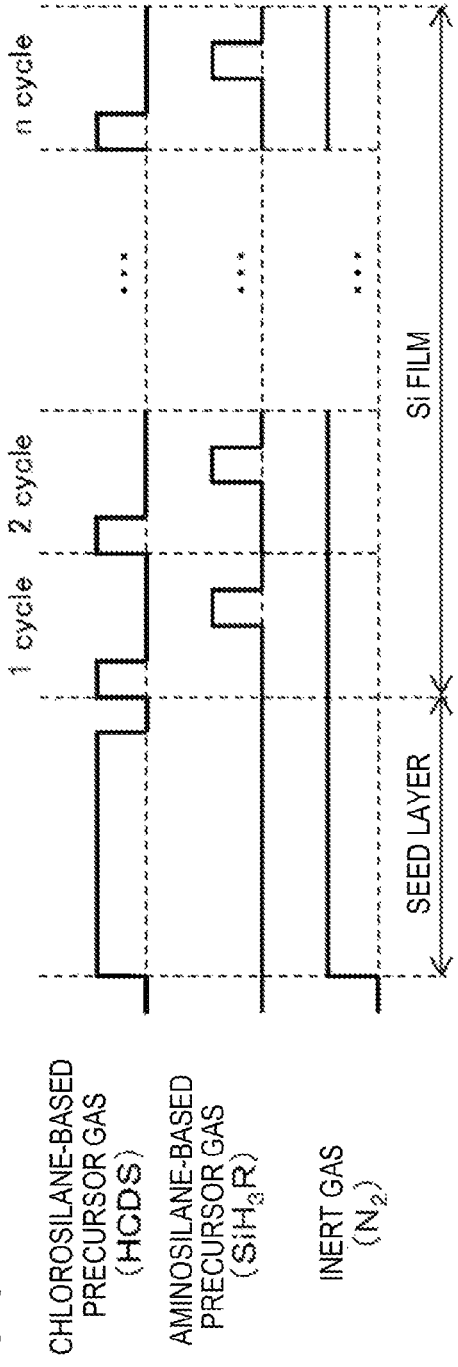
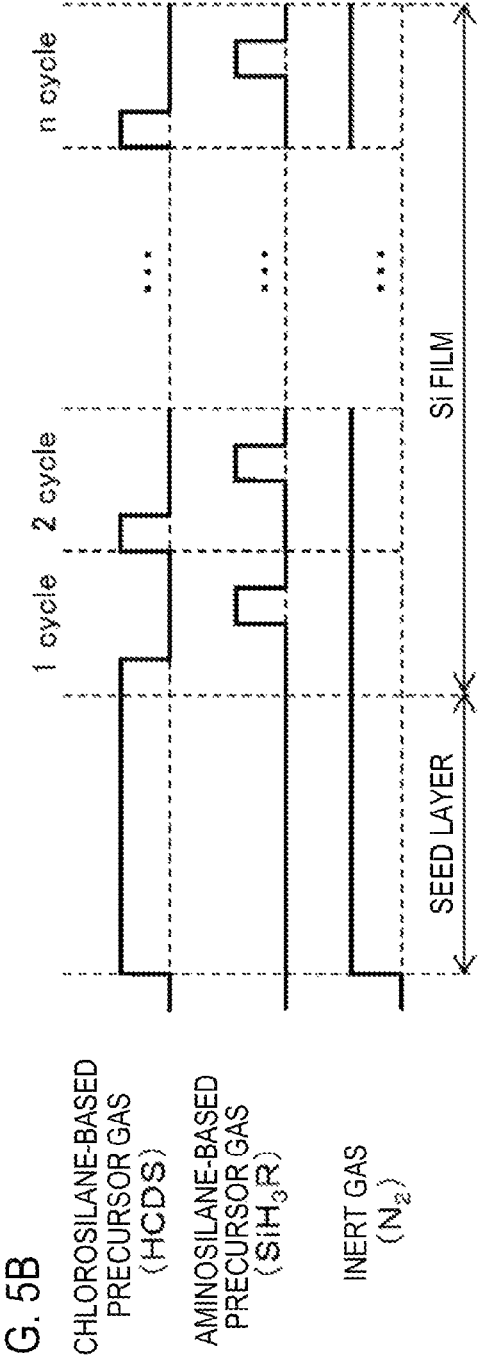

FILM FORMING METHOD AND RECORDING MEDIUM FOR PERFORMING THE METHOD

CROSS-REFERENCE TO RELATED APPLICATION

This application is based upon and claims the benefit of priority from Japanese Patent Application No. 2013-043539, filed on Mar. 5, 2013, the entire contents of which are incorporated herein by reference.

TECHNICAL FIELD

The present disclosure relates to a method of manufacturing a semiconductor device including a process of forming a thin film on a substrate, a substrate processing apparatus, and a recording medium.

BACKGROUND

A process of manufacturing a semiconductor device may include a process of forming a thin film on a substrate by supplying a precursor to the substrate.

However, if an insulating film is formed on a surface of a substrate that is a base of film formation, in some cases, step coverage of a thin film may decrease, or a discontinuous film having a pinhole (breakpoint) or the like may be formed. In particular, such phenomenon occurs remarkably, when a film thickness of a thin film to be formed is set to fall within, for example, a so-called thin film range of 5 Å to 100 Å, or when trenches having a high aspect ratio are formed in a surface of the substrate. The use of the discontinuous thin film, for example, in a channel of a transistor device or the like may deteriorate electrical characteristics of the device. Furthermore, the use of the discontinuous thin film as an etching stopper of an etching process using hydrogen fluoride (HF) or the like in the manufacturing process of the device may partially damage a substrate surface of a base, i.e., an insulating film formed on the substrate surface, resulting in deterioration of characteristics of the device or a production yield.

Furthermore, when an insulating film is formed on the surface of the substrate, even if a supply of a precursor to the substrate is started, in some cases, formation of a thin film on the substrate is not easily started, resulting in an increase in an incubation time. As a result, the productivity of the device decreases, and the manufacturing cost increases.

SUMMARY

The present disclosure provides some embodiments of a method of manufacturing a semiconductor device, a substrate processing apparatus and a recording medium, which improve step coverage of a thin film, and productivity of the film forming process, when forming the thin film on a substrate having an insulating film formed thereon.

According to one embodiment of the present disclosure, a method of manufacturing a semiconductor device, includes: treating a surface of an insulating film formed on a substrate by supplying a first precursor containing a predetermined element and a halogen group to the substrate; and forming a thin film containing the predetermined element on the treated surface of the insulating film by performing a cycle a predetermined number of times, the cycle comprising: supplying a second precursor containing the predetermined element and a halogen group to the substrate; and supplying a third precursor to the substrate.

According to another embodiment of the present disclosure, a substrate processing apparatus, includes: a process chamber configured to accommodate a substrate; a first precursor supply system configured to supply a first precursor containing a predetermined element and a halogen group into the process chamber; a second precursor supply system configured to supply a second precursor containing the predetermined element and a halogen group into the process chamber; a third precursor supply system configured to supply a third precursor into the process chamber; and a control unit configured to control the first precursor supply system, the second precursor supply system, and the third precursor supply system so as to perform a process of treating a surface of an insulating film formed on the substrate by supplying the first precursor to the substrate in the process chamber, and a process of forming a thin film containing the predetermined element on the treated surface of the insulating film by performing a cycle a predetermined number of times, the cycle comprising: supplying the second precursor to the substrate in the process chamber; and supplying the third precursor to the substrate in the process chamber.

According to still another embodiment of the present disclosure, a non-transitory computer-readable recording medium stores a program that causes a computer to perform a process of treating a surface of an insulating film formed on a substrate by supplying a first precursor containing a predetermined element and a halogen group to the substrate; and forming a thin film containing the predetermined element on the treated surface of the insulating film by performing a cycle a predetermined number of times, the cycle comprising: supplying a second precursor containing the predetermined element and a halogen group to the substrate in the process chamber; and supplying a third precursor to the substrate in the process chamber.

BRIEF DESCRIPTION OF THE DRAWINGS

FIG. 5A is a diagram illustrating a gas supply timing in the film forming sequence of an embodiment of the present disclosure.

FIG. 5B is a diagram illustrating a gas supply timing in a film forming sequence of another embodiment.

DETAILED DESCRIPTION

First Embodiment of Present Disclosure

Hereinafter, a first embodiment of the present disclosure will be described in detail with reference to the drawings.

(1) Configuration of Substrate Processing Apparatus

Figure 1:
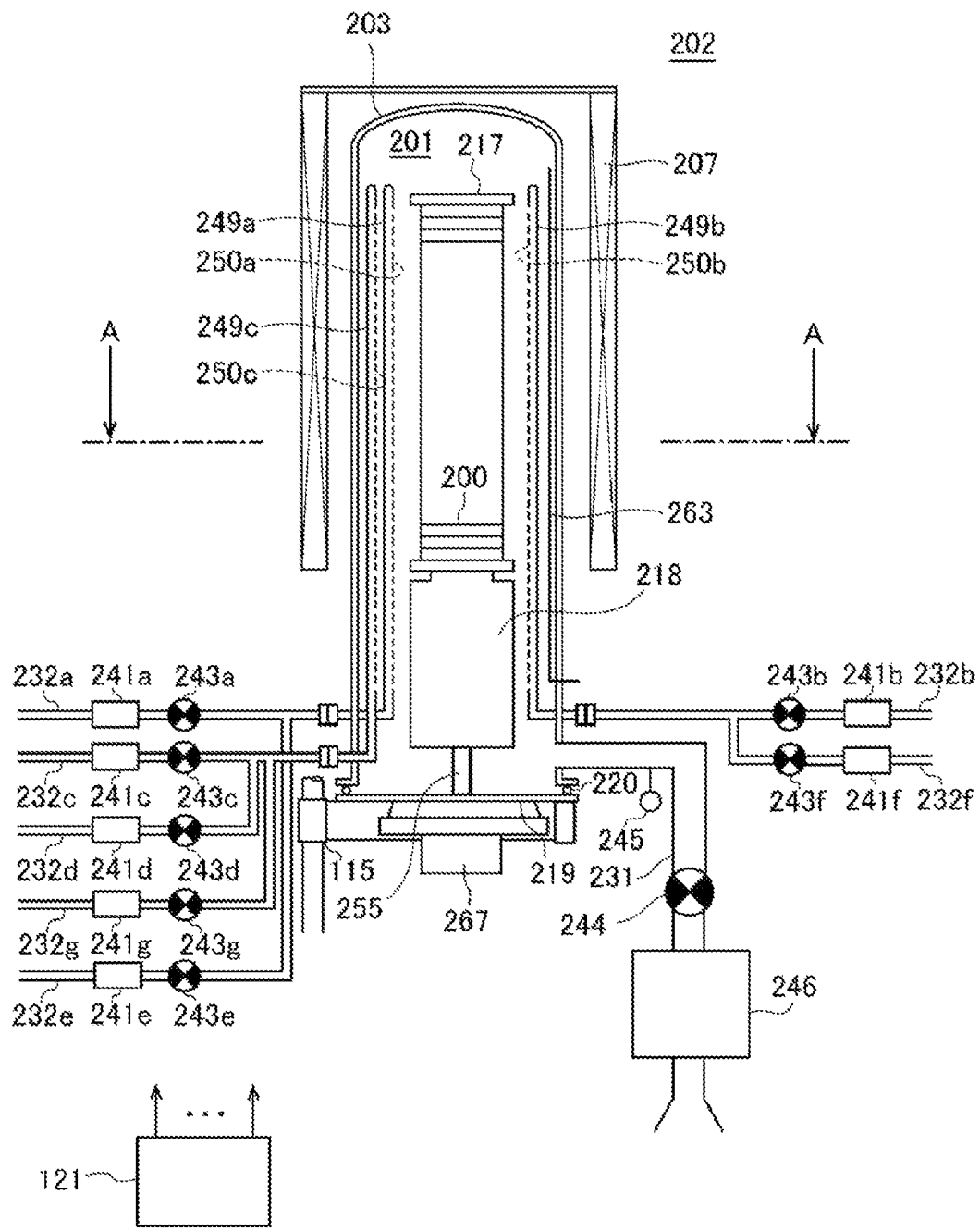
FIG. 1 is a schematic view illustrating a configuration of a vertical processing furnace of a substrate processing apparatus according to some embodiments of the present disclosure, in which a portion of the processing furnace is shown in a longitudinal sectional view.
Figure 2:
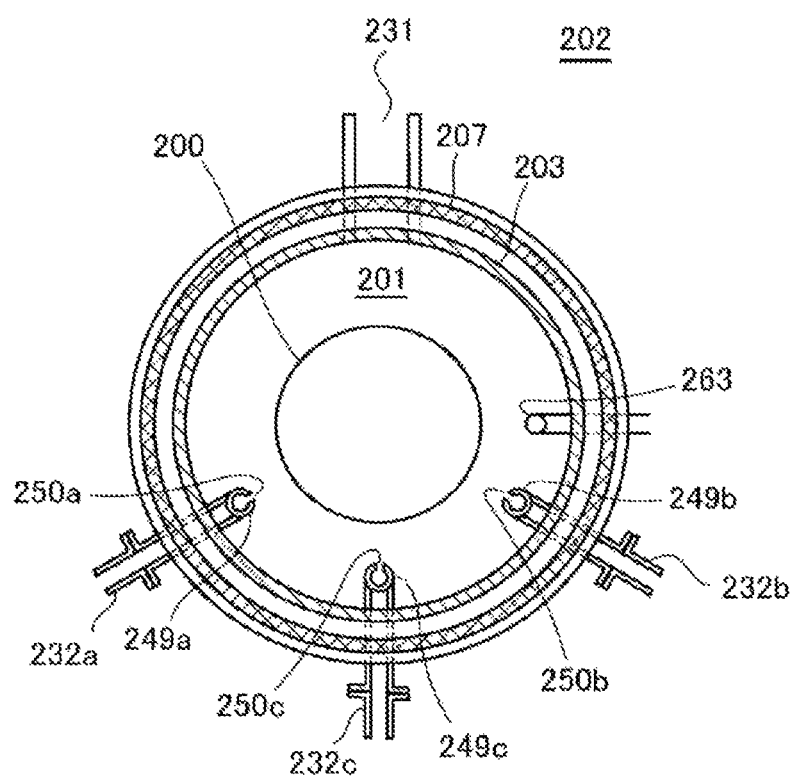
FIG. 2 is a schematic view illustrating a configuration of the vertical processing furnace of the substrate processing apparatus according to some embodiments of the present disclosure, in which a portion of the processing furnace is shown in a cross-sectional view taken along a line A-A in FIG. 1.

FIG. 1 is a schematic view illustrating a configuration of a vertical processing furnace of a substrate processing apparatus according to some embodiments, in which a portion of a processing furnace 202 is shown by a longitudinal cross-sectional view. FIG. 2 is a schematic view illustrating a configuration of the vertical processing furnace according to some embodiments, in which a portion of the processing furnace 202 is shown by a cross-sectional view taken along a line A-A of FIG. 1.

As shown in FIG. 1, the processing furnace 202 has a heater 207 as a heating unit (a heating mechanism). The heater 207 has a cylindrical shape and is vertically installed by being supported by a heater base as a support plate (not shown). The heater 207 also functions as an activation mechanism (an exciting unit) configured to activate (excite) gas by heat, as will be described below.

A reaction tube 203 which constitutes a reaction vessel (a process vessel) is disposed inside the heater 207 in a concentric form along the heater 207. The reaction tube 203 is made of a heat resistant material such as, for example, quartz ($SiO_2$) or silicon carbide (SiC) and has a cylindrical shape with its upper end closed and its lower end opened. A process chamber 201 is formed in a hollow cylindrical portion of the reaction tube 203 and is configured to accommodate wafers 200 as substrates. The wafers 200 are horizontally stacked in multiple stages to be aligned in a vertical direction in a boat 217 which will be described below.

A first nozzle 249a, a second nozzle 249b, and a third nozzle 249c are installed in the process chamber 201 so as to penetrate a lower portion of the reaction tube 203. A first gas supply pipe 232a, a second gas supply pipe 232b, and a third gas supply pipe 232c are connected to the first nozzle 249a, the second nozzle 249b, and the third nozzle 249c, respectively. Furthermore, a fourth gas supply pipe 232d is connected to the third gas supply pipe 232c. In this way, the three nozzles 249a to 249c and the four gas supply pipes 232a to 232d are provided in the reaction tube 203 to allow several kinds (four kinds in this example) of gases to be supplied into the process chamber 201.

Furthermore, a manifold (not shown) made of metal which supports the reaction tube 203 may be installed below the reaction tube 203, and each nozzle may be installed to penetrate a side wall of the metallic manifold. In this case, an exhaust pipe 231 to be described below may be further installed in the metallic manifold. Further, the exhaust pipe 231 may be installed at a lower portion of the reaction tube 203 rather than at the metallic manifold. In this way, a furnace opening portion of the processing furnace 202 may be made of metal and the nozzle or the like may be mounted on the metallic furnace opening portion.

A mass flow rate controller (MFC) 241a serving as a flow rate controller (a flow control unit) and a valve 243a serving as an opening/closing valve are installed in the first gas supply pipe 232a sequentially from an upstream direction. Furthermore, a first inert gas supply pipe 232e is connected to the first gas supply pipe 232a at a downstream side of the valve 243a. An MFC 241e serving as a flow rate controller (a flow rate control unit) and a valve 243e serving as an opening/closing valve are installed in the first inert gas supply pipe 232e sequentially from an upstream direction. Furthermore, the above-described first nozzle 249a is connected to a front end of the first gas supply pipe 232a. The first nozzle 249a is installed in an arc-shaped space between an inner wall of the reaction tube 203 and the wafers 200. The first nozzle 249a is vertically disposed along the inner wall of the reaction tube 203 to rise upward in a stacking direction of the wafers 200. That is, the first nozzle 249a is installed in a flank of a wafer arrangement region where the wafers 200 are arranged. The first nozzle 249a is configured as an L-shaped long nozzle, a horizontal portion thereof is installed to penetrate a lower sidewall of the reaction tube 203, and a vertical portion thereof is installed to rise from one end to the other end of the wafer arrangement region. A plurality of gas supply holes 250a through which gas is supplied is formed at a side surface of the first nozzle 249a. The gas supply holes 250a are opened toward a center of the reaction tube 203 so that gas can be supplied toward the wafer 200. The gas supply holes 250a are disposed at a predetermined opening pitch from a lower portion to an upper portion of the reaction tube 203. The plurality of gas supply holes 250a has the same opening area.

A first gas supply system is mainly configured by the first gas supply pipe 232a, the MFC 241a, and the valve 243a. Also, the first nozzle 249a may be considered to be included in the first gas supply system. Furthermore, a first inert gas supply system is mainly configured by the first inert gas supply pipe 232e, the MFC 241e, and the valve 243e. The first inert gas supply system also functions as a purge gas supply system.

An MFC 241b serving as a flow rate controller (a flow rate control unit) and a valve 243b serving as an opening/closing valve are installed in the second gas supply pipe 232b sequentially from an upstream direction. Furthermore, a second inert gas supply pipe 232f is connected to the second gas supply pipe 232b at a downstream side of the valve 243b. An MFC 241f serving as a flow rate controller (a flow rate control unit) and a valve 243f serving as an opening/closing valve are installed in the second inert gas supply pipe 232f sequentially from an upstream direction. Furthermore, the above-described second nozzle 249b is connected to a front end of the second gas supply pipe 232b. The second nozzle 249b is installed in an arc-shaped space between the inner wall of the reaction tube 203 and the wafers 200. The second nozzle 249b is vertically disposed along the inner wall of the reaction tube 203 to rise upward in the stacking direction of the wafers 200. That is, the second nozzle 249b is installed in the flank of the wafer arrangement region where the wafers 200 are arranged. The second nozzle 249b is configured as an L-shaped long nozzle, a horizontal portion thereof is installed to penetrate a lower sidewall of the reaction tube 203, and a vertical portion thereof is installed to rise from one end to the other end of the wafer arrangement region. A plurality of gas supply holes 250b through which gas is supplied is formed at a side surface of the second nozzle 249b. The gas supply holes 250b are opened toward a center of the reaction tube 203 so that gas can be supplied toward the wafer 200. The gas supply holes 250b are disposed at a predetermined opening pitch from the lower portion to the upper portion of the reaction tube 203. The plurality of gas supply holes 250b has the same opening area.

A second gas supply system is mainly configured by the second gas supply pipe 232b, the MFC 241b, and the valve 243b. Also, the second nozzle 249b may be considered to be included in the second gas supply system. Furthermore, the second inert gas supply system is mainly configured by the second inert gas supply pipe 232f, the MFC 241f, and the valve 243f. The second inert gas supply system also functions as a purge gas supply system.

An MFC 241c serving as a flow rate controller (a flow rate control unit) and a valve 243c serving as an opening/closing valve are installed in the third gas supply pipe 232c sequentially from an upstream direction. Furthermore, a fourth gas supply pipe 232d is connected to the third gas supply pipe 232c at a downstream side of the valve 243c. An MFC 241d serving as a flow rate controller (a flow rate control unit) and a valve 243d serving as an opening/closing valve are installed in the fourth gas supply pipe 232d sequentially from an upstream direction. Moreover, a third inert gas supply pipe 232g is connected to the third gas supply pipe 232c at a downstream side of a connection position between the third gas supply pipe 232c and the fourth gas supply pipe 232d. An MFC 241g serving as a flow rate controller (a flow rate control unit) and a valve 243g serving as an opening/closing valve are installed in the third inert gas supply pipe 232g sequentially from an upstream direction. Furthermore, the above-described third nozzle 249c is connected to a front end of the third gas supply pipe 232c. The third nozzle 249c is installed in an arc-shaped space between the inner wall of the reaction tube 203 and the wafers 200. The third nozzle 249c is vertically disposed along the inner wall of the reaction tube 203 to rise upward in the stacking direction of the wafers 200. That is, the third nozzle 249c is installed in the flank of the wafer arrangement region where the wafers 200 are arranged. The third nozzle 249c is configured as an L-shaped long nozzle, a horizontal portion thereof is installed to penetrate a lower sidewall of the reaction tube 203, and a vertical portion thereof is installed to rise from one end to the other end of the wafer arrangement region. A plurality of gas supply holes 250c through which gas is supplied is formed on a side surface of the third nozzle 249c. The gas supply holes 250c are opened toward a center of the reaction tube 203 so that gas can be supplied toward the wafer 200. The gas supply holes 250c are disposed at a predetermined opening pitch from the lower portion to the upper portion of the reaction tube 203. The openings of each of the plurality of gas supply holes 250c, each have the same opening area.

A third gas supply system is mainly configured by the third gas supply pipe 232c, the MFC 241c, and the valve 243c. Also, the third nozzle 249c may be considered to be included in the third gas supply system. Furthermore, a fourth gas supply system is mainly configured by the fourth gas supply pipe 232d, the MFC 241d, and the valve 243d. Moreover, the third nozzle 249c may be considered to be included in the fourth gas supply system at a downstream side of a connection position with the fourth gas supply pipe 232d in the third gas supply pipe 232c. Moreover, a third inert gas supply system is mainly configured by a third inert gas supply pipe 232g, an MFC 241g, and a valve 243g. The third inert gas supply system also functions as a purge gas supply system.

Thus, in the method of supplying the gas in this embodiment, the gases are transferred via the nozzles 249a to 249c disposed in an elongated arc-shaped space defined between the inner wall of the reaction tube 203 and the end portion of the plurality of stacked wafers 200, and the gases are first ejected into the reaction tube 203 in the vicinity of the wafer 200 from the gas supply holes 250a to 250c which are openings in the nozzles 249a to 249c, respectively. Thus, the main flow paths of the gases in the reaction tube 203 are set in a direction parallel to the surfaces of the wafers 200, that is, in a horizontal direction. With such a configuration, the gas can be uniformly supplied to each wafer 200, thereby obtaining an effect of making a film thickness of a thin film formed on each wafer 200 uniform. The gas flowing over the surface of the wafer 200, that is, the residual gas after reaction, flows in the direction of an exhaust pipe 231 to be described later, but the direction of the flow of the residual gas is appropriately specified depending on a position of the exhaust port, and is not limited to a vertical direction.

From the first gas supply pipe 232a, as a first precursor containing a predetermined element and a halogen group and a second precursor containing a predetermined element and a halogen group, for example, a chlorosilane-based precursor gas containing at least silicon (Si) and a chloro group, is supplied into the process chamber 201 via the MFC 241a, the valve 243a, and the first nozzle 249a. Here, the chlorosilane-based precursor gas is a chlorosilane-based precursor in a gaseous state, for example, a gas obtained by vaporizing the chlorosilane-based precursor in a liquid state under normal temperature and pressure, a chlorosilane-based precursor in a gaseous state under normal temperature and pressure or the like. Further, the chlorosilane-based precursor is a silane-based precursor having a chloro group as a halogen group, and is a precursor containing at least Si and Cl. In other words, the chlorosilane-based precursor used herein may refer to a kind of halide. In the case of using the term "precursor" herein, it may refer to a "liquid precursor in a liquid state", "precursor gas in a gaseous state" or both of them. Therefore, in the case of using the term "chlorosilane-based precursor" as used herein, it may refer to a "chlorosilane-based precursor in a liquid state", a "chlorosilane-based precursor gas in a gaseous state", or both of them. As the chlorosilane-based precursor, for example, hexachlorodisilane ($Si_2Cl_6$, abbreviation: HCDS) can be used. Furthermore, in the case of using a liquid precursor such as HCDS which is in a liquid state under normal temperature and pressure, the liquid precursor may be vaporized by a vaporization system such as a vaporizer or a bubbler to be supplied as a precursor gas (HCDS gas).

From the second gas supply pipe 232b, as a third precursor containing a predetermined element and an amino group (amine group), for example, a aminosilane-based precursor gas containing at least Si and an amino group, is supplied into the process chamber 201 via the MFC 241b, the valve 243b, and the second nozzle 249b. Here, the aminosilane-based precursor gas is an aminosilane-based precursor in a gaseous state, for example, a gas obtained by vaporizing the aminosilane-based precursor in a liquid state under normal temperature and pressure, an aminosilane-based precursor in a gaseous state under normal temperature and pressure or the like. Further, the aminosilane-based precursor is a silane-based precursor having an amino group (also a silane-based precursor also containing an alkyl group such as a methyl group, an ethyl group or a butyl group), and is a silane-based precursor containing at least Si, carbon (C), and nitrogen (N). That is, the aminosilane-based precursor used herein may also be referred to as an organic precursor, and an organic aminosilane-based precursor. Furthermore, when using the term "the aminosilane-based precursor" herein, it may refer to an "aminosilane-based precursor in a liquid state", "aminosilane-based precursor gas in a gaseous state" or both of them. As the aminosilane-based precursor, it is possible to use, for example, monoaminosilane ($SiH_3R$) which is a precursor containing one amino group in the composition formula (one molecule). Here, R represents a ligand, and in this case, R represents an amino group in which one or two hydrocarbon groups including one or more C atoms is/are coordinated in one N atom (one or both of H of an amino group represented by $NH_2$ is/are substituted with a hydrocarbon group including one or more C atoms). When two hydrocarbon groups constituting a part of the amino group are coordinated in one N, both of them may be the same hydrocarbon group, or may be different hydrocarbon groups from each other. Further, the hydrocarbon group may include an unsaturated bond such as a double bond or a triple bond. Further, the amino group may have a cyclic structure. For example, as $SiH_3R$, it is possible to use (ethylmethylamino) silane ($SiH_3[N(CH_3)(C_2H_5)]$), (dimethylamino) silane ($SiH_3[N(CH_3)_2]$), (diethylpiperidino) silane ($SiH_3[NC_5H_8(C_2H_5)_2]$) or the like. Furthermore, when using a liquid precursor such as $SiH_3R$ which is in a liquid state under normal temperature and pressure, the liquid precursor may be vaporized by a vaporization system such as a vaporizer or a bubbler to be supplied as a precursor gas ($SiH_3R$ gas).

From the third gas supply pipe 232c, as a fourth precursor containing a predetermined element, for example, a silane-based precursor gas containing Si and containing no Cl, C, N, and oxygen (O), that is, an inorganic silane-based precursor gas is supplied into the process chamber 201 via the MFC 241c, the valve 243c, the third nozzle 249c. In this case, the inorganic silane-based precursor gas may also be referred to as a silane-based precursor gas containing no Cl, C, N, and O. As a silane-based precursor gas (inorganic silane-based precursor gas), for example, a monosilane ($SiH_4$) gas can be used.

From the fourth gas supply pipe 232d, as a fifth precursor containing a predetermined elemental and an amino groups (amine group), for example, an aminosilane-based precursor gas containing at least Si and an amino group, is supplied into the process chamber 201 via the MFC 241d, the valve 243d, the third gas supply pipe 232c, and the third nozzle 249c. As an aminosilane-based precursor gas, for example, it is possible to use a trisdimethylaminosilane ($Si[N(CH_3)_2]_3H$, abbreviation: 3DMAS) gas that is a precursor containing a plurality of amino groups in the composition formula (In one molecule). When using a liquid precursor that is in a liquid state under room temperature and atmospheric pressure, such as 3DMAS, the liquid precursor is vaporized by a vaporization system such as a vaporizer or a bubbler to be supplied as a precursor gas as (3DMAS gas).

From the inert gas supply pipes 232e to 232g, as an inert gas, for example, a nitrogen ($N_2$) gas is supplied into the process chamber 201 via the MFCs 241e to 241g, the valves 243e to 243g, the gas supply pipes 232a to 232c, and the nozzles 249a to 249c, respectively.

When allowing the gases as described above to flow from each gas supply pipe, respectively, a first precursor supply system configured to supply a first precursor containing a predetermined element and a halogen group, that is, a chlorosilane-based precursor gas supply system as a first precursor gas supply system, is configured by the first gas supply system. Furthermore, a second precursor supply system configured to supply a second precursor containing a predetermined element and a halogen group, that is, a chlorosilane-based precursor gas supply system as a second precursor gas supply system, is configured by the first gas supply system. Moreover, the chlorosilane-based precursor gas supply system is also simply referred to as a chlorosilane-based precursor supply system. Furthermore, a third precursor supply system configured to supply a third precursor containing a predetermined element and an amino group, that is, an aminosilane-based precursor gas supply system as a third precursor gas supply system, is configured by the second gas supply system. Moreover, the aminosilane-based precursor gas supply system is also simply referred to as an aminosilane-based precursor supply system. Furthermore, a fourth precursor supply system configured to supply a fourth precursor containing a predetermined element, that is, a silane-based precursor gas supply system (inorganic silane-based precursor gas supply system) as a fourth precursor gas supply system, is configured by the third gas supply system. Moreover, the silane-based precursor gas supply system (inorganic silane-based precursor gas supply system) is also simply referred to as a silane-based precursor supply system (inorganic silane-based precursor supply system). Furthermore, a fifth precursor supply system configured to supply a fifth precursor containing a predetermined element and an amino group, that is, an aminosilane-based precursor gas supply system as a fifth precursor gas supply system, is configured by the fourth gas supply system. Moreover, the aminosilane-based precursor gas supply system is also simply referred to as an aminosilane-based precursor supply system.

The exhaust pipe 231 configured to exhaust an internal atmosphere in the process chamber 201 is installed in the reaction tube 203. As shown in FIG. 2, when seen from a horizontal cross-sectional view, the exhaust pipe 231 is installed at a side opposite to a side of the reaction tube 203 in which the gas supply holes 250a of the first nozzle 249a, the gas supply hole 250b of the second nozzle 249b, and the gas supply hole 250c of the third nozzle 249c are formed, that is, at a side opposite to the gas supply holes 250a to 250c with the wafer 200 interposed therebetween. Further, in a longitudinal cross-sectional view as shown in FIG. 1, the exhaust pipe 231 is provided below a position where the gas supply holes 250a to 250c are formed. With such a configuration, the gas supplied to the vicinity of the wafers 200 in the process chamber 201 through the gas supply holes 250a to 250c flows in a horizontal direction, i.e., in a direction parallel to the surfaces of the wafers 200, and then flows downward and is exhausted from the exhaust pipe 231. As described above, the main flow of the gas in the process chamber 201 is directed in the horizontal direction.

A vacuum pump 246 as a vacuum exhaust device is connected to the exhaust pipe 231 via a pressure sensor 245 as a pressure detector (pressure detecting unit) configured to detect the internal pressure of the process chamber 201, and an auto pressure controller (APC) valve 244 as a pressure adjuster (pressure adjusting unit). Furthermore, the APC valve 244 is configured to be able to perform and stop the vacuum-exhaust of the process chamber 201 by opening and closing the valve in the state of operating the vacuum pump 246, and to adjust the internal pressure of the process chamber 201 by adjusting a degree of valve opening in the state of operating the vacuum pump 246. An exhaust system is mainly configured by the exhaust pipe 231, the APC valve 244, and the pressure sensor 245. Furthermore, the vacuum pump 246 may be considered to be included in the exhaust system. The exhaust system is configured to be able to perform the vacuum-exhaust such that the internal pressure of the process chamber 201 becomes a predetermined pressure (vacuum level), by adjusting the degree of valve opening of the APC valve 244 on the basis of the pressure information detected by the pressure sensor 245, while operating the vacuum pump 246.

A seal cap 219, which functions as a furnace port cover capable of hermetically sealing a lower end opening of the reaction tube 203, is installed below the reaction tube 203. The seal cap 219 is configured to come into contact with the lower end portion of the reaction tube 203 from the downside in the vertical direction. The seal cap 219 is made of, for example, a metal such as stainless steel, and is formed in a disc shape. An O-ring 220, which is a seal member in contact with the lower end portion of the reaction tube 203, is installed on the upper surface of the seal cap 219. On a side of the seal cap 219 opposite to the process chamber 201, a rotation mechanism 267 as a substrate holder to be described later configured to rotate a boat 217 is installed. A rotary shaft 255 of the rotation mechanism 267 is connected to the boat 217 through the seal cap 219. The rotation mechanism 267 is configured to rotate the wafers 200 by rotating the boat 217. The seal cap 219 is configured to be vertically raised and lowered by a boat elevator 115 as an elevating mechanism vertically installed at the outside of the reaction tube 203. The boat elevator 115 is configured to be able to load and unload the boat 217 into and from the process chamber 201 by raising and lowering the seal cap 219. In other words, the boat elevator 115 is configured as a transfer device (a transfer mechanism) that transfers the boat 217, that is, the wafers 200 into and out of the process chamber 201.

The boat 217, which is used as a substrate support device, is made of, for example, a heat resistant material such as quartz or silicon carbide, and is configured to support a plurality of wafers 200 horizontally stacked in multiple stages with the centers of the wafers 200 concentrically aligned. A heat insulating member 218, for example, made of a heat resistant material, such as quartz and silicon carbide, is installed at the lower portion of the boat 217 and configured such that heat from the heater 207 is not easily transmitted to the seal cap 219. In addition, the heat insulating member 218 may be configured by a plurality of heat insulating plates made of a heat resistant material such as quartz or silicon carbide, and a heat insulating plate holder configured to support these heat insulating plates at a horizontal position in multiple stages.

A temperature sensor 263, which is a temperature detector, is installed in the reaction tube 203 such that the interior of the process chamber 201 reaches a desired temperature distribution by adjusting an electric conduction state to the heater 207 based on the temperature information detected by the temperature sensor 263. The temperature sensor 263 is configured in an L shape similarly to the nozzles 249a, 249b, and 249c and installed along the inner wall of the reaction tube 203.

Figure 3:
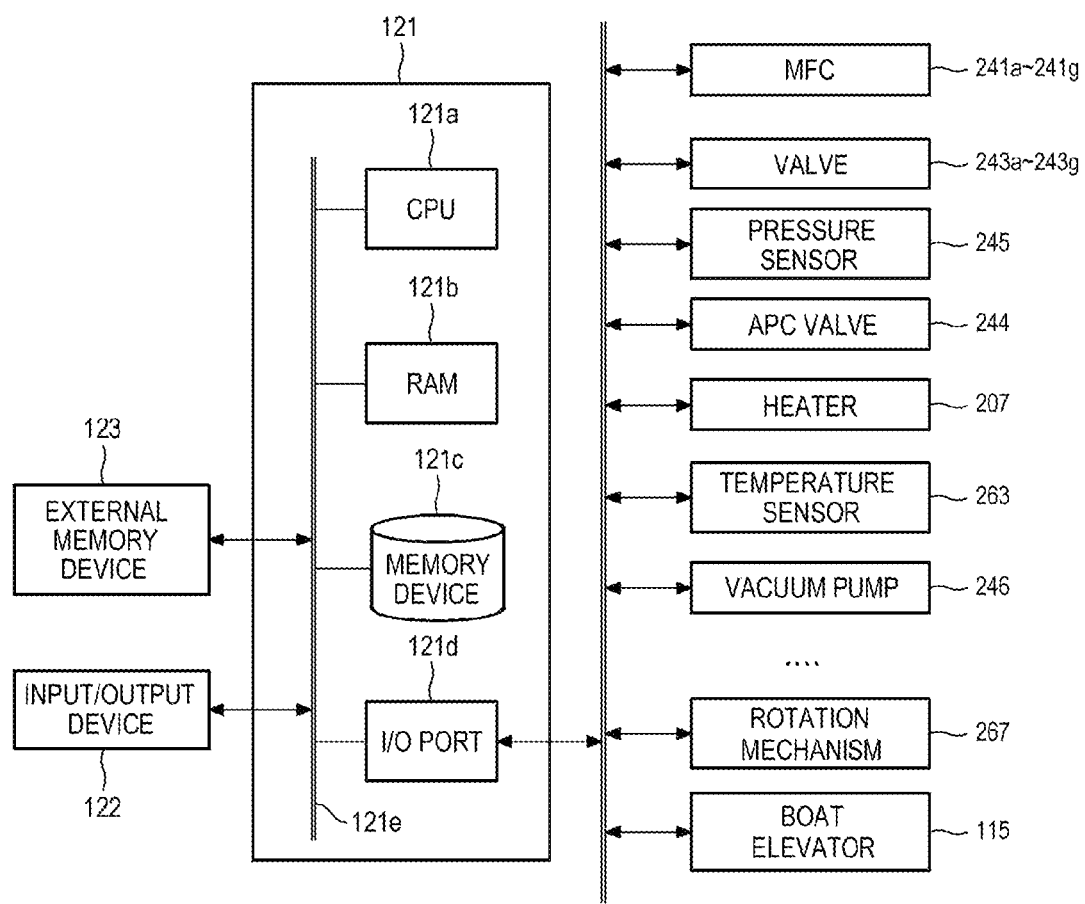
FIG. 3 is a schematic view illustrating a configuration of a controller of the substrate processing apparatus according to some embodiments of the present disclosure, in which a control system of the controller is shown by a block diagram.

As shown in FIG. 3, a controller 121 serving as a control part (control unit) is configured as a computer that is equipped with a central processing unit (CPU) 121a, a random access memory (RAM) 121b, a storage device 121c, and an I/O port 121d. The RAM 121b, the storage device 121c, and the I/O port 121d are configured to be able to exchange data with the CPU 121a via an internal bus 121e. An input/output device 122 including, for example, a touch panel or the like, is connected to the controller 121.

The storage device 121c is configured by, for example, a flash memory, a hard disk drive (HDD) or the like. A control program for controlling the operation of the substrate processing apparatus or a process recipe, in which a procedure, condition of processing the substrate and the like described later are written, is readably stored in the storage device 121c. Furthermore, the process recipe functions as a program to cause the controller 121 to execute each procedure in a substrate processing process described later to obtain a predetermined result. Hereinafter, the process recipe, the control program and the like may be generally simply referred to as a program. When using the term "program" herein, it may indicate a case of including only a process recipe, a case of including only a control program, or a case of using both of them. In addition, the RAM 121b is configured as a memory region (work area) in which the program, the data or the like read by the CPU 121a is temporarily stored.

The I/O port 121d is connected to the MFC 241a to 241g, the valves 243a to 243g, the pressure sensor 245, the APC valve 244, the vacuum pump 246, the heater 207, the temperature sensor 263, the rotation mechanism 267, the boat elevator 115 and the like.

The CPU 121a is configured to read and execute the control program from the storage device 121c and to read the process recipe from the storage device 121c in accordance with an input of an operation command or the like from the input/output device 122. Moreover, the CPU 121a is configured to control the flow rate adjusting operation of various gases using the MFC 241a to 241g, the opening and closing operation of the valves 243a to 243g, the opening and closing operation of the APC valve 244, and the pressure adjusting operation of the APC valve 244 based on the pressure sensor 245, the temperature adjusting operation of the heater 207 based on the temperature sensor 263, the start-up and stop operation of the vacuum pump 246, the rotation and rotation speed adjusting operation of the boat 217 by the rotation mechanism 267, the elevation operation of the boat 217 by the boat elevator 115 or the like, according to the contents of the process recipe that has been read.

Furthermore, the controller 121 is not limited to a case of being configured as a dedicated computer but may be configured as a general-purpose computer. For example, it is possible to configure the controller 121 according to this embodiment, by preparing an external storage device 123 that stores the above-described program (for example, a magnetic tape, a magnetic disk such as a flexible disk or a hard disk, an optical disk such as a CD or a DVD, a magneto-optical disk such as an MO, and a semiconductor memory such as a USB memory or a memory card), and installing the program on the general-purpose computer using the external storage device 123. Furthermore, a means for supplying a program to a computer is not limited to a case in which the program is supplied via the external storage device 123. For example, the program may be supplied by the use of communication means such as the Internet or a dedicated line, rather than using the external storage device 123. The storage device 121c or the external storage device 123 is configured as a non-transitory computer-readable recording medium. Hereinafter, these are collectively and simply referred to as a "recording medium". In the case of using the term "recording medium" herein, it may include a case of including only the storage device 121c, a case of including only the external storage device 123 alone, or a case of including both of them.

(2) Substrate Processing Process

Figure 4:
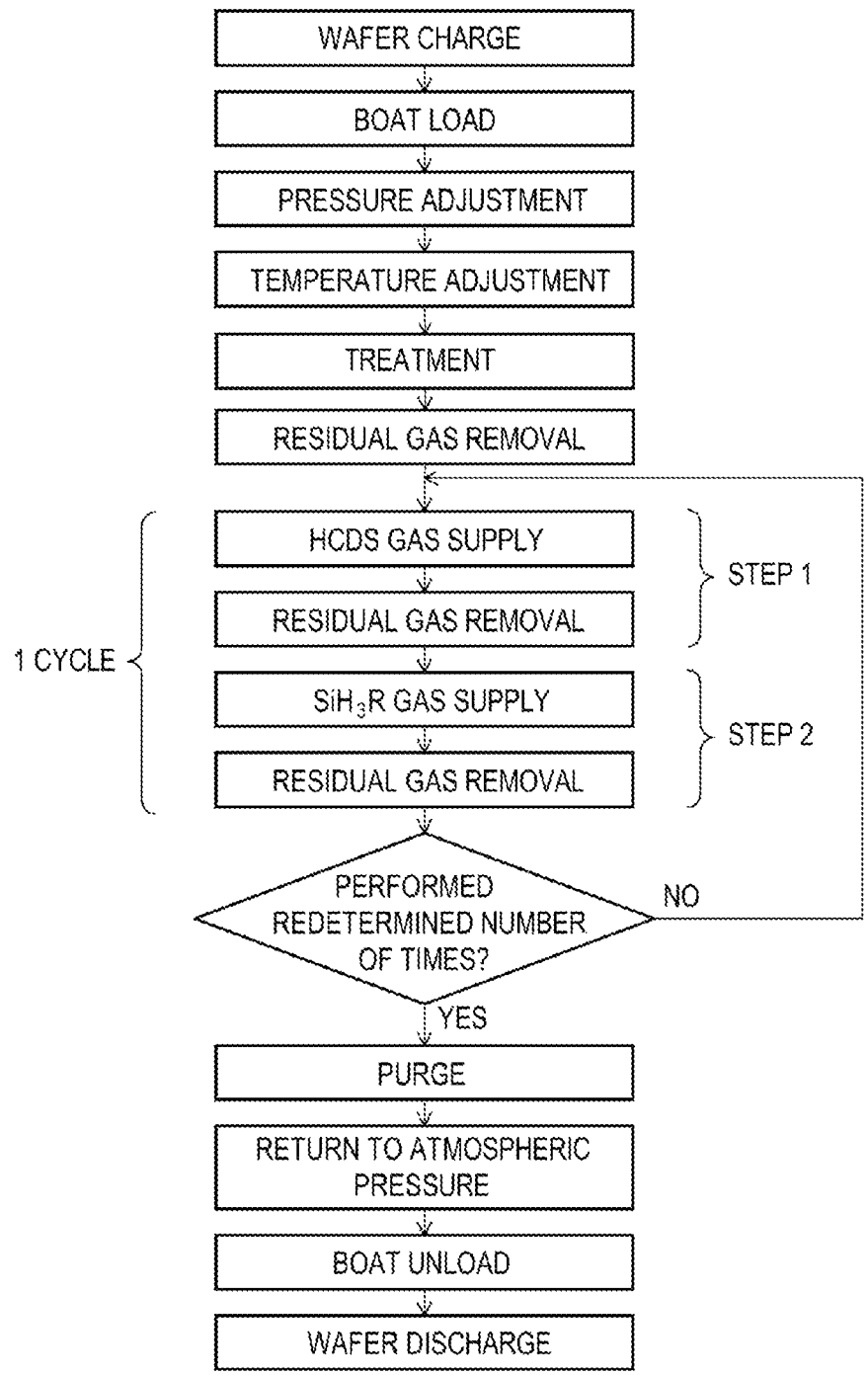
FIG. 4 is a diagram illustrating a film forming flow in a film forming sequence of an embodiment of the present disclosure.

Next, a sequence example of performing treatment on a surface of an insulating film formed on a surface of a substrate and then forming a thin film containing a predetermined element on a surface of a treated insulating film, as one process of manufacturing processes of a semiconductor device (device), using the processing furnace 202 of the above-described substrate processing apparatus will be described with reference to FIGS. 4 and 5A. FIG. 4 is a flow chart illustrating a film forming flow of a film forming sequence, according to some embodimentsl. FIG. 5A is a gas supply timing diagram in the film forming sequence, according to some embodiments. In the following description, operations of each part constituting the substrate processing apparatus are controlled by the controller 121.

In a film forming sequence of the embodiment, the following processes are performed:

performing treatment on a surface of an insulating film formed on a substrate by supplying a first precursor containing a predetermined element and a halogen group to the substrate with the insulating film formed thereon; and forming a thin film containing the predetermined element on the surface of the treated insulating film by performing a cycle a predetermined number of times, the cycle including: supplying a second precursor containing the predetermined element and a halogen group to the substrate; and supplying a third precursor to the substrate.

Here, the expression "performing a cycle including supplying a second precursor and supplying a third precursor a predetermined number of times" includes a case of performing the cycle once, and a case of repeating this cycle multiple times. In other words, it means that the cycle is performed one or more times (a predetermined number of times).

Hereinafter, the film forming sequence of the embodiment will be specifically described. Here, an example, in which a silicon film (Si film) composed of Si is formed on a surface of a silicon oxide film ($SiO_2$ film, hereinafter, also referred to as an SiO film) serving as an insulating film formed on the surface of the wafer 200, using an HCDS gas which is a chlorosilane-based precursor gas as the first precursor and the second precursor, and using an $SiH_3R$ gas which is an aminosilane-based precursor gas as the third precursor, by the film forming flow of FIG. 4 and the film forming sequence of FIG. 5A, will be described. Furthermore, the SiO film becomes a part of a base film when forming an Si film in an Si film forming process which will be described later.

Moreover, when the term "wafer" is used herein, it may refer to "the wafer itself" or "the wafer and a laminated body (a collected body) of predetermined layers or films formed on a surface thereof" (i.e., the wafer including the predetermined layers or films formed on the surface may be referred to as a wafer). In addition, the phrase "a surface of a wafer" as used herein may refer to "a surface (an exposed surface) of a wafer itself" or "a surface of a predetermined layer or film formed on the wafer, i.e., the uppermost surface of the wafer as a laminated body."

Therefore, the expression "supplying a predetermined gas to a wafer" herein may mean that "a predetermined gas is directly supplied to a surface (exposed surface) of a wafer itself" or that "a predetermined gas is supplied to a layer or a film formed on a wafer, i.e., to an uppermost surface of a wafer as a laminated body." In addition, the expression "a predetermined layer (or film) is formed on a wafer" may mean that "a predetermined layer (or film) is directly formed on a surface (an exposed surface) of a wafer itself" or that "a predetermined layer (or film) is formed on a layer or a film formed on a wafer, i.e., on an uppermost surface of a wafer as a laminated body."

Moreover, the term "substrate" as used herein may be synonymous with the term "wafer," and in this case, the terms "wafer" and "substrate" may be used interchangeably in the above description.

(Wafer Charging and Boat Loading)

When a plurality of wafers 200 is charged on the boat 217 (wafer charging), as shown in FIG. 1, the boat 217 supporting the plurality of wafers 200 is raised by the boat elevator 115 and loaded into the process chamber 201 (boat loading). In this state, the seal cap 219 seals the lower end of the reaction tube 203 via the O-ring 220.

(Pressure Adjustment and Temperature Adjustment)

The interior of the process chamber 201, that is, a space in which the wafers 200 are present is vacuum evacuated by the vacuum pump 246 such that the interior of the process chamber 201 reaches a desired pressure (vacuum level). At this time, the internal pressure of the process chamber 201 is measured by the pressure sensor 245, and the APC valve 244 is feedback-controlled based on the measured pressure information (pressure adjustment). Furthermore, the vacuum pump 246 maintains a regular operation state at least until processing of the wafers 200 is terminated. Furthermore, the interior of the process chamber 201 is heated by the heater 207 to a desired temperature. At this time, an electrical conduction state to the heater 207 is feedback-controlled based on the temperature information detected by the temperature sensor 263 such that the interior of the process chamber 201 reaches a desired temperature distribution (temperature adjustment). In addition, heating of the interior of the process chamber 201 by the heater 207 is continuously performed at least until processing of the wafers 200 is terminated. Next, the boat 217 and the wafers 200 begin to be rotated by the rotation mechanism 267. Furthermore, the rotation of the boat 217 and the wafers 200 by the rotation mechanism 267 is continuously performed at least until processing on the wafers 200 is terminated.

(Treatment Process)

Thereafter, a treatment process (pre-process) is performed on the surface of the SiO film formed on the surface of the wafer 200. In this process, a seed layer containing Cl as a halogen group and Si as a predetermined element is formed on the surface of the SiO film, as an initial layer.

The valve 243a of the first gas supply pipe 232a is opened to flow the HCDS gas into the first gas supply pipe 232a. A flow rate of the HCDS gas flowing into the first gas supply pipe 232a is adjusted by the MFC 241a. The flow rate-adjusted HCDS gas is supplied into the process chamber 201 from the gas supply holes 250a of the first nozzle 249a, and exhausted from the exhaust pipe 231. At this time, the HCDS gas is supplied to the wafer 200. At the same time, the valve 243e is opened to flow an inert gas such as an $N_2$ gas into the first inert gas supply pipe 232e. A flow rate of the $N_2$ gas flowing through the first inert gas supply pipe 232e is adjusted by the MFC 241e. The flow rate-adjusted $N_2$ gas is supplied into the process chamber 201 together with the HCDS gas, and exhausted from the exhaust pipe 231.

Furthermore, at this time, in order to prevent the infiltration of the HCDS gas into the second nozzle 249b and the third nozzle 249c, the valves 243f and 243g are opened to flow the $N_2$ gas into the second inert gas supply pipe 232f and the third inert gas supply pipe 232g. The $N_2$ gas is supplied into the process chamber 201 through the second gas supply pipe 232b, the third gas supply pipe 232c, the second nozzle 249b, and the third nozzle 249c, and exhausted from the exhaust pipe 231.

At this time, the APC valve 244 is appropriately adjusted to set the internal pressure of the process chamber 201 to fall within a range of, for example, 1 to 13300 Pa, or more specifically, 20 to 1330 Pa. Furthermore, a supply flow rate of the HCDS gas controlled by the MFC 241a is set to fall within a range of, for example, 1 to 1000 sccm. A supply flow rate of the $N_2$ gas controlled by the MFCs 241e to 241g is set to fall within a range of, for example, 100 to 10000 sccm.

Furthermore, at this time, if the supply flow rate of the HCDS gas is set to be greater than the supply flow rate of the HCDS gas in an Si film forming process to be described later, or the internal pressure of the process chamber 201 is set to be greater than the internal pressure of the process chamber 201 when supplying the HCDS gas in the Si film forming process to be described later, it is possible to increase a forming rate of a seed layer on the surface of the SiO film, thereby improving the total productivity in the film forming process. Also, the seed layer is easily formed in a continuous layer, and as a result, it is possible to improve flatness of the Si film formed in the Si film forming process to be described later, that is, a uniformity of a film thickness in a plane of the wafer 200. Further, it is also possible to improve step coverage of the Si film.

Furthermore, a time of supplying the HCDS gas to the wafer 200, i.e., a gas supply time (irradiation time) of the HCDS gas, is set to be longer than a gas supply time of the HCDS gas per cycle in the Si film forming process to be described later. Specifically, the gas supply time of the HCDS gas is set to fall within a range of, for example, 120 seconds or more to 1200 seconds or less, more specifically, 300 seconds or more to 900 seconds or less, or further more specifically, 600 seconds or more to 900 seconds or less.

When the gas supply time is less than 120 seconds, a thickness of a seed layer formed on the surface of the SiO film becomes too thin (for example, becomes a thickness of less than 0.5 Å), and the seed layer becomes a discontinuous layer. In this case, since the Si film forming process to be described later is performed in a state in which the SiO film is partially exposed, a uniformity of a film thickness of an Si film to be formed in a plane of the wafer 200 is likely to decrease, and the step coverage is likely to decrease. If the gas supply time is set to 120 seconds or more, the seed layer can be continuously formed, that is, the seed layer can become a continuous layer. Furthermore, if the gas supply time is set to 300 seconds (5 minutes) or more, or more specifically 600 seconds (10 minutes) or more, it becomes easier to provide a continuous seed layer. As a result, even if the film thickness of the Si film is set to fall within a so-called thin film range, for example, 5 Å to 100 Å, or more specifically, 20 Å to 100 Å, it is possible to provide a continuous Si film having no pinholes. Further, it is also possible to increase the flatness of the Si film surface, i.e., to improve the uniformity of the film thickness of the Si film in a plane of the wafer 200. Further, it is also possible to improve the step coverage of the Si film.

Further, when the gas supply time exceeds 1800 seconds (30 minutes), a thickness of the seed layer formed on the surface of the SiO film becomes too thick (becomes a thickness of, for example, more than 2 Å). Thus, when a laminated film of the seed layer formed on the SiO film and the Si film is considered in total, an impurity concentration of Cl or the like in the film (in particular, a lower layer) may increase, resulting in a change of film quality. Further, total consumption of the HCDS gas in the treatment process increases, resulting in an increase of film forming costs. As the gas supply time is set to 1800 seconds or less, such problems can be solved. In particular, as the gas supply time is set to 1200 seconds (20 minutes) or more, or 900 seconds (15 minutes) or less, the total film quality of the laminated film of the seed layer and the Si film formed on the SiO film may become a more appropriate film quality. Further, it is possible to more appropriately suppress the amount of waste of the HCDS gas in the treatment process, thereby further reducing the film forming costs.

Furthermore, a temperature of the wafer 200 is set to fall within a range of, for example, 250 to 700 degrees C., more specifically, 300 to 650 degrees C., or further more specifically, 350 to 650 degrees C.

When the temperature of the wafer 200 is less than 250 degrees C., the seed layer is hardly formed on the surface of the SiO film, resulting in a failure to obtain a forming rate of a practical seed layer. This problem can be solved by setting the temperature of the wafer 200 to 250 degrees C or more. Also, by setting the temperature of the wafer 200 to 300 degrees C. or more or 350 degrees C. or more, the seed layer can be more sufficiently formed on the surface of the SiO film, thereby further increasing the forming rate of the seed layer.

Furthermore, when the temperature of the wafer 200 exceeds 700 degrees C., since a CVD reaction is strengthened (a gaseous reaction becomes dominant), a uniformity of a thickness of the seed layer in a plane of the wafer 200 may easily deteriorate making it difficult to control the uniformity. By setting the temperature of the wafer 200 to 700 degrees C. or less, deterioration of the uniformity of the thickness of the seed layer in a plane of the wafer 200 can be suppressed, and thus, it is possible to control the uniformity. In particular, a surface reaction becomes dominant by setting the temperature of the wafer 200 to 650 degrees C. or less or 600 degrees C., the uniformity of the thickness of the seed layer in a plane of the wafer 200 can be easily secured, and thus, it becomes easy to control the uniformity.

In this way, when the temperature of the wafer 200 is set to fall within a range of, for example, 250 to 700 degrees C., more specifically 300 to 650 degrees C., or further more specifically, 350 to 600 degrees C., it is possible to allow the treatment process, i.e., the formation of the seed layer on the surface of the SiO film to progress.

However, although the details will be described later, when the temperature of the wafer 200 is less than 300 degrees C., it is hard for a modification reaction (modification reaction of the first layer) in Step 2 of the Si film forming process to be described later to progress. By setting the temperature of the wafer 200 to 300 degrees C. or more, it is possible to facilitate the progress of the modification reaction in Step 2. Further, by setting the temperature of the wafer 200 to 350 degrees C. or more, the modification reaction in Step 2 becomes more active. In addition, when the temperature of the wafer 200 exceeds 450 degrees C., it is difficult to allow the modification reaction in Step 2 to appropriately progress. That is, in order to allow the process in Step 2 of the Si film forming process to be described later to efficiently and appropriately progress, the temperature of the wafer 200 may be set in the range of, for example, 300 to 450 degrees C., or more specifically, 350 to 450 degrees C.

In this way, appropriate temperature conditions differ between the treatment process and Step 2 of the Si film forming process to be described later, and a temperature range suitable for allowing Step 2 of the Si film forming process to be described later to progress may be included in a temperature range suitable for allowing the treatment process to progress. Here, as in this embodiment, when the treatment step and the Si film forming process are continuously performed in the same process chamber 201, in order to improve the total throughput, the temperature of the wafer 200 may be set to have the same temperature conditions in the treatment process and the Si film forming process to be described later. That is, the temperature conditions of the wafer 200 in the treatment process may be set to be equal to the temperature conditions of the wafer 200 in the Si film forming process to be described later. Therefore, in the treatment process, the temperature of the wafer 200 may be set to fall within a range of, for example, 300 to 450 degrees C., or more specifically, 350 to 450 degrees C. Within this temperature range, it is possible to allow the process (formation of the seed layer) in the treatment process and the processes (formation of the first layer, and modification of the first layer) in Steps 1 and 2 of the Si film forming process to be described later to efficiently and appropriately progress, respectively.

By supplying the HCDS gas to the wafer 200 under the above-described conditions, as a seed layer having a thickness of, for example, 0.5 to 2 Å, a layer containing Cl as a halogen group, and more specifically, a layer containing Cl as a halogen group and Si as a predetermined element is formed on the SiO film on the surface of the wafer 200. The seed layer becomes a continuous and flat layer throughout the entire areas in the surface of the wafer 200, as described above. Furthermore, the surface of the seed layer becomes a surface terminated by an Si—Cl bond (hereinafter, also simply referred to as Cl termination). By the Cl termination, the surface of the seed layer becomes a surface on which the Si layer easily grows in the Si film forming process described later as compared to the surface of the SiO film.

(Residual Gas Removal)

After the seed layer is formed on the surface of the SiO film, the valve 243a of the first gas supply pipe 232a is closed to stop the supply of the HCDS gas. At this time, while the APC valve 244 of the exhaust pipe 231 is in an open state, the interior of the process chamber 201 is vacuum exhausted by the vacuum pump 246, and the HCDS gas remaining in the process chamber 201 which does not react or remains after contributing to the formation of the seed layer is removed from the process chamber 201. Furthermore, at this time, the valves 243e to 243g are in an open state, and the supply of the $N_2$ gas as an inert gas into the process chamber 201 is maintained. The $N_2$ gas acts as a purge gas, and thus, it is possible to increase an effect of removing the HCDS gas remaining in the process chamber 201 which does not react or remains after contributing to the formation of the seed layer from the process chamber 201.

Moreover, at this time, the gas remaining in the process chamber 201 may not be completely removed, and the interior of the process chamber 201 may not be completely purged. When the gas remaining in the process chamber 201 is very small in amount, there is no adverse effect generated in the Si film forming process performed thereafter. At this time, an amount of the $N_2$ gas supplied into the process chamber 201 need not be a large amount, and, for example, approximately the same amount of the $N_2$ gas as the volume of the reaction tube 203 (the process chamber 201) may be supplied to perform the purge such that there is no adverse effect generated in the Si film forming process. As described above, as the interior of the process chamber 201 is not completely purged, the purge time can be reduced, thereby improving the throughput. In addition, the consumption of the $N_2$ gas can also be suppressed to a minimal necessity.

As the chlorosilane-based precursor gas, an inorganic precursor gas such as a tetrachlorosilane, i.e., silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, and a monochlorosilane ($SiH_3Cl$, abbreviation: MCS) gas may be used, in addition to the hexachlorodisilane ($Si_2Cl_6$, abbreviation: HCDS) gas. As the inert gas, a rare gas such as an Ar gas, a He gas, an Ne gas, and a Xe gas may be used, in addition to the $N_2$ gas.

[Si film Forming Process]

When the treatment process on the surface of the SiO film, i.e., the formation of the seed layer on the surface of the SiO film, is completed, the following two steps, i.e., Steps 1 and 2 are executed.

[Step 1]

(HCDS Gas Supply)

Here, by the same processing procedure as the treatment process, the HCDS gas as the second precursor is supplied to the wafer 200.

At this time, the APC valve 244 is appropriately adjusted to set the internal pressure of the process chamber 201 to fall within a range of, for example, 1 to 13300 Pa, or more specifically, 20 to 1330 Pa. A supply flow rate of the HCDS gas controlled by the MFC 241a is set to fall within a range of, for example, 1 to 1000 sccm. A supply flow rate of the $N_2$ gas controlled by each of the MFCs 241e to 241g is set to fall within a range of, for example, 100 to 10000 sccm. A time of supplying the HCDS gas to the wafer 200, i.e., a gas supply time (irradiation time), is set to fall within a range of, for example, 1 to 120 seconds, or more specifically, 1 to 60 seconds.

At this time, when the temperature of the wafer 200 is less than 250 degrees C., very little of the HCDS is chemically adsorbed onto the wafer 200, and the practical film forming rate may not be obtained. It is possible to solve this problem by setting the temperature of the wafer 200 to 250 degrees C. or more. Furthermore, by setting the temperature of the wafer 200 to 300 degrees C. or more, or more specifically 350 degrees C. or more, it is possible to more sufficiently adsorb the HCDS onto the seed layer, and it is possible to obtain a more sufficient film forming rate. Further, when the temperature of the wafer 200 exceeds 700 degrees C., the film thickness uniformity may easily deteriorate making it difficult to control the film thickness uniformity as a CVD reaction is strengthened (a gaseous reaction becomes dominant). It is possible to suppress deterioration of the film thickness uniformity by setting the temperature of the wafer 200 to 700 degrees C. or less and to control the film thickness uniformity. In particular, a surface reaction becomes dominant by setting the temperature of the wafer 200 to 650 degrees C. or less, or more specifically 600 degrees C or less, the film thickness uniformity can be easily secured, and thus, it is easy to control the film thickness uniformity. Accordingly, when the temperature of the wafer 200 is set to fall within a range of, for example, 250 to 700 degrees C., more specifically, 300 to 650 degrees C., or further more specifically, 350 to 600 degrees C., it is possible to allow the process (formation of the first layer to be described later) in Step 1 to progress.

However, although the details will be described later, when the temperature of the wafer 200 is less than 300 degrees C., it is hard for a modification reaction (modification reaction of the first layer) in Step 2 of the Si film forming process to be described later to progress. It is possible to facilitate the progress of the modification reaction in Step 2 by setting the temperature of the wafer 200 to 300 degrees C. or more. Further, the modification reaction in Step 2 becomes more active by setting the temperature of the wafer 200 to 350 degrees C. or more. In addition, when the temperature of the wafer 200 exceeds 450 degrees C., it is difficult to allow the modification reaction in Step 2 to properly progress. That is, in order to allow the process in Step 2 to efficiently and appropriately progress, the temperature of the wafer 200 may be set in the range of, for example, 300 to 450 degrees C., or more specifically, 350 to 450 degrees C.

In this way, appropriate temperature conditions differ between Steps 1 and 2, and a temperature range suitable for allowing Step 2 to progress may be included in a temperature range suitable for allowing Step 1 to progress. Here, in order to improve the throughput of the Si film forming process of performing the cycle including Steps 1 and 2 a predetermined number of times, the temperature of the wafer 200 in Steps 1 and 2 may be set to have the same temperature conditions. That is, the temperature conditions of the wafer 200 in Step 1 may be set to be equal to the temperature conditions of the wafer 200 in Step 2. Therefore, in Step 1, the temperature of the wafer 200 may be set to fall within a range of, for example, 300 to 450 degrees C., or more specifically, 350 to 450 degrees C. Within this temperature range, it is possible to allow the process (formation of the first layer) in Step 1 and the process (modification of the first layer) in Step 2 to efficiently and appropriately progress, respectively.

By supplying the HCDS gas under the above-described conditions, the Si-containing layer containing chlorine (Cl) having a thickness, for example, of less than one atomic layer to several atomic layers is formed on the seed layer as the first layer. The first layer may be an adsorption layer of the HCDS gas, an Si layer containing Cl, or both.

Here, the Si layer containing Cl is a generic name including a discontinuous layer as well as a continuous layer formed of Si and containing Cl, or an Si thin film containing Cl formed by laminating the discontinuous layer and the continuous layer. Also, in some cases, a continuous layer formed of Si and containing Cl may be referred to as an Si thin film containing Cl. In addition, Si forming the Si layer containing Cl also includes Si, in which bonding to Cl is completely broken, in addition to Si in which bonding to Cl is not completely broken.

Moreover, the adsorption layer of the HCDS gas also includes a chemisorption layer in which gas molecules of the HCDS gas are discontinuous, in addition to a chemisorption layer in which the gas molecules of the HCDS gas are continuous. That is, the adsorption layer of the HCDS gas includes a chemisorption layer having a thickness of one molecular layer constituted by HCDS molecules or less than one molecular layer. Further, HCDS ($Si_2Cl_6$) molecules constituting the adsorption layer of the HCDS gas also contains molecules in which bonding of Si and Cl is partially broken ($Si_xCl_y$ molecules). That is, the adsorption layer of the HCDS gas includes a chemisorption layer in which $Si_2Cl_6$ molecules and/or $Si_xCl_y$ molecules are continuous, or a chemisorption layer in which $Si_2Cl_6$ molecules and/or $Si_xCl_y$ molecules are discontinuous.

Also, a layer having a thickness of less than one atomic layer refers to a discontinuously formed atomic layer, and a layer having a thickness of one atomic layer refers to a continuously formed atomic layer. In addition, a layer having a thickness of less than one molecular layer refers to a discontinuously formed molecular layer, and a layer having a thickness of one molecular layer refers to a continuously formed molecular layer.

Under a condition in which the HCDS gas is autolyzed (pyrolyzed), i.e., under a condition in which a pyrolysis reaction of the HCDS gas occurs, the Si layer containing Cl is formed by depositing Si on the seed layer. Under a condition in which the HCDS gas is not autolyzed (pyrolyzed), i.e., under a condition in which a pyrolysis reaction of the HCDS gas does not occur, the adsorption layer of the HCDS gas is formed by adsorbing the HCDS gas onto t the seed layer. In addition, forming of the Si layer containing Cl on the seed layer can increase the film forming rate rather than forming of the adsorption layer of the HCDS gas on the seed layer.

When the thickness of the first layer formed on the seed layer exceeds several atomic layers, an effect of modification reaction in Step 2 described later is not applied to the entire first layer. In addition, a minimum value of the thickness of the Si layer that can be formed on the wafer 200 is less than one atomic layer. Accordingly, the thickness of the first layer may be approximately less than one atomic layer to several atomic layers. In addition, as the thickness of the first layer is set to one atomic layer or less, i.e., one atomic layer or less than one atomic layer, an effect of the modification reaction in Step 2 described later can be relatively increased, and thus a time required for the modification reaction in Step 2 can be reduced. A time required for forming the first layer in Step 1 can also be reduced. As a result, a processing time per one cycle can be reduced, and a total processing time can also be reduced. That is, the film forming rate can also be increased.

In addition, controllability of the film thickness uniformity can also be increased by setting the thickness of the first layer to one atomic layer or less.

Furthermore, the first layer is formed on the SiO film after the treatment process, that is, on the continuously formed seed layer. As a result, as will be described later, when the Si film is formed by performing the cycle including Steps 1 and 2 a predetermined number of times, even if the film thickness thereof is set to fall within a so-called thin film range, for example, 5 Å to 100 Å, it is possible to form a film having no pinholes. Further, it is also possible to improve the film thickness uniformity and improve the step coverage of the film.

Furthermore, since the first layer is formed on the SiO film after the treatment process, that is, on the seed layer whose surface is Cl terminated, when Steps 1 and 2 are set to one cycle and the cycle is performed a predetermined number of times, the formation of the Si layer described later is efficiently (without delay) started from an early stage (from a stage in which a cycle was performed less number of times). That is, it is possible to shorten an incubation time of the Si film, thereby improving the total productivity of the Si film forming process. Furthermore, it is possible to suppress the total consumption of the precursor gas, in particular, the consumption of a relatively expensive aminosilane-based precursor gas supplied in Step 2 described below, thereby reducing the film forming costs.

Further, since the above-described seed layer is continuously formed throughout the entire region on the surface of the wafer 200, it is possible to uniformly align the incubation time of the Si film, that is, the timing of growth start of the Si layer to be described below throughout the entire region on the surface of the wafer 200. Thus, it is possible to suppress the influence of the timing offset of the growth start on the film thickness, thereby improving the film thickness uniformity of the Si film in the plane of the wafer 200.

(Residual Gas Removal)

After the first layer is formed, the interior of the process chamber 201 is vacuum exhausted by the same procedure as the treatment process, and the HCDS gas remaining in the process chamber 201 which does not react or remains after contributing to the formation of the first layer is removed from the process chamber 201.

Moreover, at this time, the gas remaining in the process chamber 201 may not be completely removed, and the interior of the process chamber 201 may not be completely purged. When the gas remaining in the process chamber 201 is very small in amount, there is no adverse effect generated in Step 2 performed thereafter. At this time, an amount of the $N_2$ gas supplied into the process chamber 201 need not be a large amount, and, for example, approximately the same amount of the $N_2$ gas as the volume of the reaction tube 203 (the process chamber 201) may be supplied to perform the purge such that there is no adverse effect generated in Step 2. As described above, as the interior of the process chamber 201 is not completely purged, the purge time can be shortened, thereby improving the throughput. In addition, the consumption of the $N_2$ gas can also be suppressed to a minimal necessity.

As the chlorosilane-based precursor gas, an inorganic precursor gas such as a tetrachlorosilane, i.e., silicon tetrachloride ($SiCl_4$, abbreviation: STC) gas, a trichlorosilane ($SiHCl_3$, abbreviation: TCS) gas, a dichlorosilane ($SiH_2Cl_2$, abbreviation: DCS) gas, and a monochlorosilane ($SiH_3Cl$, abbreviation: MCS) gas may be used, in addition to the hexachlorodisilane ($Si_2Cl_6$, abbreviation: HCDS) gas. As the inert gas, a rare gas such as an Ar gas, an He gas, an Ne gas, and a Xe gas may be used, in addition to the $N_2$ gas.

[Step 2]
(SiH₃R Gas Supply)

After Step 1 is terminated and the residual gas in the process chamber 201 is removed, the valve 243b of the second gas supply pipe 232b is opened to allow SiH₃R gas to flow, as a third precursor, into the second gas supply pipe 232b. A flow rate of the SiH₃R gas flowing into the second gas supply pipe 232b is adjusted by the MFC 241b. The flow rate-adjusted SiH₃R gas is supplied into the process chamber 201 through the gas supply holes 250b of the second nozzle 249b, and exhausted from the exhaust pipe 231. At this time, the SiH₃R gas is supplied to the wafer 200. At the same time, the valve 243f is opened to allow the flow of N₂ gas as an inert gas into the second inert gas supply pipe 232f. A flow rate of the N₂ gas flowing in the second inert gas supply pipe 232f is adjusted by the MFC 241f. The flow rate-adjusted N₂ gas is supplied into the process chamber 201 together with the SiH₃R gas, and exhausted through the exhaust pipe 231.

Furthermore, at this time, in order to prevent infiltration of the SiH₃R gas into the first nozzle 249a and the third nozzle 249c, the valves 243e and 243g are opened to allow the flow of N₂ gas into the first inert gas supply pipe 232e and the third inert gas supply pipe 232g. The N₂ gas is supplied into the process chamber 201 through the first gas supply pipe 232a, the third gas supply pipe 232c, the first nozzle 249a, and the third nozzle 249c, and exhausted through the exhaust pipe 231.

At this time, the APC valve 244 is appropriately adjusted to set the internal pressure of the process chamber 201 to fall within a range of, for example, 1 to 13300 Pa, or more specifically, 20 to 1330 Pa. A supply flow rate of the SiH₃R gas controlled by the MFC 241b is set to fall within a range of, for example, 1 to 1000 sccm. A supply flow rate of the N₂ gas controlled by each of the MFCs 241e to 241g is set to fall within a range of, for example, 100 to 10000 sccm. A time for supplying the SiH₃R gas to the wafer 200, i.e., a gas supply time (irradiation time), is set to fall within a range of, for example, 1 to 120 seconds, or more specifically, for example, 1 to 60 seconds.

In this case, similarly to Step 1, a temperature of the heater 207 is set such that a temperature of the wafer 200 falls within a range of, for example, 300 to 450 degrees C., more specifically, 300 to 450 degrees C., or further more specifically, 350 to 450 degrees C.

When the temperature of the wafer 200 is less than 300 degrees C., the SiH₃R gas supplied to the wafer 200 is hardly autolyzed (pyrolyzed), and a ligand (R) containing an amino group is hardly separated from Si in the SiH₃R gas. That is, the number of the ligands (R) that react with the first layer (Si-containing layer containing Cl) formed in Step 1 is likely to become insufficient. As a result, a removal reaction of Cl from the first layer becomes difficult.

The SiH₃R gas supplied to the wafer 200 is easily pyrolyzed by setting the temperature of the wafer 200 to 300 degrees C. or more, and thus, the ligand (R) containing an amino group is easily separated from Si in the SiH₃R gas. Moreover, as the separated ligand (R) reacts with the halogen group (Cl) in the first layer, the removal reaction of Cl from the first layer easily occurs. Further, pyrolysis of the SiH₃R gas supplied to the wafer 200 becomes more active by setting the temperature of the wafer 200 to 350 degrees or more, and thus, the number of the ligands (R) separated from Si in the SiH₃R gas easily increases. The removal reaction of Cl from the first layer becomes more active by an increase in the number of the ligands (R) which react with Cl in the first layer.

Moreover, thermal energy exceeding 450 degrees C. is necessary for bonding the ligand (R) containing the amino group, separated from Si in the SiH₃R gas, to Si in the first layer (the Si-containing layer from which Cl is removed), namely, Si (unpaired Si) which has a dangling bond by separating Cl from the first layer, or Si (Si which was not paired) which had dangling bond. Therefore, by setting the temperature of the wafer 200 to 450 degrees C. or less, the ligand (R) containing the amino group separated from Si in the SiH₃R gas can be prevented from being bonded to an unpaired Si in the first layer or Si which was not paired. That is, by setting the temperature of the wafer 200 to 450 degrees C. or less, the ligand (R) containing the amino group can be prevented from being introduced into the first layer. As a result, an amount of impurities such as carbon (C) or nitrogen (N) can be considerably reduced in the first layer after modification, namely, the second layer described later.

Moreover, by setting the temperature of the wafer 200 to fall within the temperature range of 300 to 450 degrees C., Si of the SiH₃R gas from which the ligand (R) is separated, namely, Si (unpaired Si) having a dangling bond included in the SiH₃R gas, is bonded to unpaired Si in the first layer or Si which was not paired, thereby facilitating the formation of Si—Si bonding.

Moreover, when the temperature of the wafer 200 exceeds 450 degrees C., the ligand (R) containing the amino group separated from Si in the SiH₃R gas can be easily bonded to unpaired Si in the first layer or Si which was not paired. That is, the ligand (R) containing the amino group can be easily introduced into the first layer. Furthermore, an amount of impurities such as carbon (C) or nitrogen (N) can easily increase in the first layer after modification, namely, the second layer described later.

Therefore, the temperature of the wafer 200 may be set to fall within a range of, for example, 300 to 450 degrees C., or more specifically, for example, 350 to 450 degrees C.

Under the above-described conditions, by supplying the SiH₃R gas to the wafer 200, the SiH₃R gas reacts with the first layer (the Si-containing layer containing Cl) which is formed on the wafer 200 in Step 1. That is, by supplying the SiH₃R gas to the wafer 200 heated at the above-described temperature, the ligand (R) containing the amino group is separated from Si in the SiH₃R gas, and the separated ligand (R) reacts with Cl in the first layer to remove Cl from the first layer. Also, by heating the wafer 200 at the above-described temperature, the ligand (R) containing the amino group separated from Si in the SiH₃R gas is prevented from being bonded to an unpaired Si in the first layer (Si-containing layer from which Cl is removed) or Si which was not paired. Moreover, an unpaired Si of the SiH₃R gas from which the ligand (R) is separated is bonded to an unpaired Si in the first layer or Si which was not paired, thereby forming Si—Si bonding. Therefore, the first layer formed on the wafer 200 in Step 1 is changed (modified) into the second layer which contains Si and is very small in content of impurities such as chlorine (Cl), carbon (C), or nitrogen (N). In addition, the second layer has a thickness of about less than one atomic layer to several atomic layers. The second layer is an Si layer (Si layer) composed of Si which is very small in content of impurities such as chlorine (Cl), carbon (C), or nitrogen (N). A crystalline structure of the Si layer has an amorphous state; thus, the Si layer may be referred to as an amorphous Si layer (a-Si layer).

Moreover, when the Si layer is formed as the second layer, Cl contained in the first layer before modification mostly reacts with the ligand (R) containing the amino group included in the SiH₃R gas while the modification reaction of the first layer is performed by the SiH₃R gas, thereby generating, for example, a gaseous reaction byproduct such as amino salt, and the gaseous reaction byproduct is discharged from the process chamber 201 through the exhaust pipe 231. Accordingly, an amount of impurities such as Cl, C, or N contained in the modified first layer, namely, the second layer, can be reduced. Also, when the $SiH_3R$ gas is used as an aminosilane-based precursor gas, since an amount of amino group contained in a composition formula thereof (an amount of amino group in one molecule) is small, that is, an amount of impurities such as C or N contained in the composition is small, an amount of impurities such as C or N contained in the modified first layer, namely, the second layer, can be easily reduced. In particular, an amount of N can be greatly reduced.

(Residual Gas Removal)

After the Si layer is formed, the valve 243b of the second gas supply pipe 232b is closed to stop the supply of the $SiH_3R$ gas. At this time, while the APC valve 244 of the exhaust pipe 231 is in an open state, the interior of the process chamber 201 is vacuum exhausted by the vacuum pump 246, and the $SiH_3R$ gas remaining in the process chamber 201 which does not react or remains after contributing to the formation of the second layer or reaction byproducts are removed from the process chamber 201. Furthermore, at this time, the valves 243e to 243g are in an open state, and the supply of the $N_2$ gas as an inert gas into the process chamber 201 is maintained. The $N_2$ gas acts as a purge gas, and thus, it is possible to increase an effect of removing the $SiH_3R$ gas remaining in the process chamber 201 which does not react or remains after contributing to the formation of the second layer or the reaction byproducts from the process chamber 201.

Moreover, at this time, the gas remaining in the process chamber 201 may not be completely removed, and the interior of the process chamber 201 may not be completely purged. When the gas remaining in the process chamber 201 is very small in amount, there is no adverse effect generated in Step 1 performed thereafter. At this time, an amount of the $N_2$ gas supplied into the process chamber 201 need not be a large amount, and, for example, approximately the same amount of $N_2$ gas as the volume of the reaction tube 203 (the process chamber 201) may be supplied to perform the purge such that there is no adverse effect generated in Step 1. As described above, as the interior of the process chamber 201 is not completely purged, the purge time can be reduced, thereby improving the throughput. In addition, the consumption of the $N_2$ gas can also be suppressed to a minimal necessity.

As an aminosilane-based precursor, organic precursors such as diaminosilane ($SiH_2RR'$), triaminosilane ($SiHRR'R''$), and tetraminosilane ($SiRR'R''R'''$)) may be used in addition to monoaminosilane ($SiH_3R$). Here, each of R, R', R'', and R''' represents a ligand, and represents an amino group in which one or two hydrocarbon groups containing one or more C atoms are coordinated in one N atom herein (one or both of H of the amino group represented by $NH_2$ is substituted with a hydrocarbon group containing one or more C atoms). If two hydrocarbon groups constituting a part of the amino group are coordinated in one N, the two hydrocarbon groups may be the same hydrocarbon group, or may be different hydrocarbon groups. Further, the hydrocarbon group may include an unsaturated bonding such as a double bond or a triple bond. Further, the amino group of each of R, R', R'', and R''' may be the same amino group, or may be different amino groups. Further, the amino group may have a cyclic structure. For example, as $SiH_2RR'$, it is possible to use bis(diethylamino)silane ($SiH_2[N(C_2H_5)_2]_2$, abbreviation: BDEAS), bis(tertiary-butylamino)silane ($SiH_2[NH(C_4H_9)]_2$, abbreviation: BTBAS), bis(diethylpiperidino)silane ($SiH_2[NC_5H_8(C_2H_5)_2]_2$, abbreviated: BDEPS) and the like. Further, as $SiHRR'R''$, it is possible to use, for example, tris(diethylamino)silane ($SiH[N(C_2H_5)_2]_3$, abbreviation: 3DEAS), tris(dimethylamino)silane ($SiH[N(CH_3)_2]_3$, abbreviation: 3DMAS) and the like. Further, as $SiRR'R''R'''$, it is possible to use, for example, tetrakis(diethylamino) silane ($Si[N(C_2H_5)_2]_4$, abbreviation: 4DEAS), tetrakis(dimethylamino)silane ($Si[N(CH_3)_2]_4$, abbreviation: 4DMAS) and the like.

Furthermore, as the aminosilane-based precursor, it is possible to use an organic precursor in which the number of ligands containing an amino group in the composition formula is two or less, and equal to or less than the number of ligands containing a halogen group in the composition formula of the chlorosilane-based precursor.

In the case of using, for example, $HCDS(Si_2Cl_6)$, STC ($SiCl_4$), TCS($SiHCl_3$), and DCS($SiH_2Cl_2$) in which the number of ligands (Cl) containing a halogen group in the composition formula is equal to or greater than 2 as a chlorosilane-based precursor, it is possible to use diaminosilane ($SiH_2RR'$) in which the number of ligands (R) containing an amino group in the composition formula is 2 as an aminosilane-based precursor, in addition to monoaminosilane ($SiH_3R$) in which the number of ligands (R) containing an amino group in the composition formula is 1. Further, in the case of using MCS($SiH_3Cl$) in which the number of ligands (Cl) containing a halogen group in the composition formula is 1 as a chlorosilane-based precursor, it is possible to use monoaminosilane ($SiH_3R$) in which the number of ligands (R) containing an amino group in the composition formula is 1 as an aminosilane-based precursor.

Further, the number of ligands (R) containing an amino group in the composition formula of the aminosilane-based precursor may be smaller than the number of ligands (Cl) containing a halogen group in the composition formula of the chlorosilane-based precursor. Therefore, in the case of using DCS in which the number of ligands (Cl) containing a halogen group in the composition formula is 2 as a chlorosilane-based precursor, it is preferable to use monoaminosilane in which the number of ligands (R) containing an amino group in the composition formula is 1 as an aminosilane-based precursor, rather than diaminosilane in which the number of ligands (R) containing an amino group in the composition formula is 2.

Further, the number of ligands (R) containing an amino group in the composition formula of the aminosilane-based precursor may be 1. Therefore, as the aminosilane-based precursor, it is possible to use monoaminosilane rather than diaminosilane. In this case, in order for the number of ligands (R) containing an amino group in the composition formula of the aminosilane-based precursor to be set to be smaller than the number of ligands (Cl) containing a halogen group in the composition formula of the chlorosilane-based precursor, it is possible to use HCDS, STC, TCS, and DCS in which the number of ligands (Cl) containing a halogen group in the composition formula is 2 or more as a chlorosilane-based precursor.

Therefore, an amount of Cl contained in the first layer (the Si-containing layer containing Cl) before modification is larger than an amount of the ligand (R) including the amino group contained in the $SiH_3R$ gas supplied to the first layer (the Si-containing layer including Cl) in Step 2. In this case, the ligand (R) containing the amino group contained in the $SiH_3R$ gas mostly reacts with Cl contained in the first layer before modification, and generate, for example, a gaseous reaction byproduct such as amino salt during the modification reaction of the first layer. The gaseous reaction byproduct is discharged from the inside of the process chamber 201 through the exhaust pipe 231. That is, the ligand (R) containing the amino group contained in the SiH₃R gas is mostly discharged from the process chamber 201 to thereby be removed without being introduced into the modified first layer, namely, the second layer. As a result, the first layer after the modification, namely, the second layer, may be changed (modified) into a silicon layer in which an amount of impurities, such as C or N, is very small.

The inert gas may include a rare gas such as an Ar gas, an He gas, an Ne gas, a Xe gas, or the like, in addition to the $N_2$ gas.

(Performing Predetermined Number of Times)

By setting the above-described Steps 1 and 2 to one cycle and performing the cycle one or more times (a predetermined number of times), it is possible to form an Si film composed of Si with a very small amount of impurities such as Cl, C, and N, as a film containing a predetermined element, on a surface of a treated SiO film, i.e., on the seed layer. Furthermore, the seed layer may be considered as part of the base film of the Si layer, or may be considered as a part of the Si film. The crystalline structure of the Si film has an amorphous state (amorphous), and the Si film may also be referred to as an amorphous silicon film (a-Si film). Furthermore, the above-described cycle may be repeated multiple times. That is, it is possible to set a thickness of the Si layer formed per cycle to be smaller than a desired thickness and to repeat the above-described cycle multiple times until the desired film thickness is obtained.

Furthermore, in the case of performing the cycle multiple times, at each step at least after the second cycle, the expression "a predetermined gas is supplied to the wafer 200" may mean that "a predetermined gas is supplied to a surface formed on the wafer 200, i.e., on the uppermost surface of the wafer 200 as a laminated body." Also, the expression "a predetermined layer is formed on the wafer 200" may mean that "a predetermined layer is formed on a layer formed on the wafer 200, i.e., on the uppermost surface of the wafer 200 as a laminated body." The above-described matters are similar to respective modified examples and other embodiments as will be described later.

(Purge and Return to Atmospheric Pressure)

When the film forming process of forming the Si film having a predetermined film thickness is performed, the valves 243e to 243g are opened to supply the $N_2$ gas as an inert gas into the process chamber 201 from each of the first inert gas supply pipe 232e and the second inert gas supply pipe 232f, and exhaust the $N_2$ gas from the exhaust pipe 231. The $N_2$ gas acts as the purge gas, whereby the interior of the process chamber 201 is purged with the inert gas, and the gas remaining in the process chamber 201 or the reaction byproducts are removed from the process chamber 201 (purge). Thereafter, an atmosphere in the process chamber 201 is substituted with the inert gas (inert gas substitution), and the internal pressure of the process chamber 201 returns to normal pressure (return to atmospheric pressure).

(Boat Unloading and Wafer Discharging)

Thereafter, the seal cap 219 is lowered by the boat elevator 115 to open the lower end of the reaction tube 203, and the processed wafer 200 supported on the boat 217 is unloaded outside of the reaction tube 203 through the lower end of the reaction tube 203 (boat unloading). Thereafter, the processed wafer 200 is discharged from the boat 217 (wafer discharging).

(3) Effects According to the Embodiment

According to the embodiment, one or a plurality of effects are provided as described below.

(a) According to the film forming sequence of the embodiment, the Si film is formed on the SiO film after the treatment process, that is, on the continuously formed seed layer. As a result, when the Si film is formed by performing the cycle including Steps 1 and 2 a predetermined number of times, even if the film thickness thereof is set to fall within a so-called thin film range, for example, 5 Å to 100 Å, or more specifically, 20 Å to 100 Å, it is possible to form an Si film having no pinholes with satisfactory film thickness uniformity. Further, it is possible to improve the step coverage of the Si film.

(b) According to the film forming sequence of the embodiment, since the Si film is formed on the SiO film after the treatment process, that is, on the seed layer on which the surface is Cl terminated, when the cycle including Steps 1 and 2 is performed a predetermined number of times, the formation of the Si layer is started from an early stage without delay. That is, it is possible to shorten an incubation time of the Si film, thereby improving the total productivity of the Si film forming process. Furthermore, it is possible to suppress the total consumption of the precursor gas, thereby reducing the film forming costs.

(c) According to the film forming sequence of the embodiment, since the above-described seed layer is continuously formed throughout the entire region in the surface of the wafer 200, it is possible to make the incubation time of the Si film uniform, that is, the timing of growth start of the Si layer throughout the entire region in the surface of the wafer 200. Thus, it is possible to suppress the influence on the film thickness due to the timing offset of the growth start, thereby improving the film thickness uniformity of the Si film in the plane of the wafer 200.

(d) According to the film forming sequence of the embodiment, when the internal pressure of the process chamber 201 in the treatment process is set to be higher than the internal pressure of the process chamber 201 during supply of the HCDS gas, or the supply flow rate of the HCDS gas in the treatment process is set to be greater than the supply flow rate of the HCDS gas in the Si film forming process, it is possible to increase a forming rate of a seed layer on the surface of the SiO film, thereby improving the total productivity in the film forming process. Also, the seed layer is easily formed to a continuous layer, and as a result, it is also possible to improve the film thickness uniformity of the Si film in the plane of the wafer 200 or the step coverage.

(e) According to the film forming sequence of the embodiment, when performing the cycle including Steps 1 and 2 a predetermined number of times, a temperature of the wafer 200 is set such that the ligand (R) containing an amino group is separated from Si in the SiH₃R gas, the separated ligand reacts with Cl in the first layer to remove Cl from the first layer, the separated ligand is prevented from being bonded to Si in the first layer, and Si obtained by separating the ligand in the SiH₃R gas is bonded to Si in the first layer. Specifically, the temperature of the wafer 200 is set to fall within a range of 300 to 450 degrees C., or more specifically a range of 350 to 450 degrees C.

Thus, it is possible to modify the first layer formed in Step 1 into a second layer (Si layer) having very small content of impurities such as Cl, C, and N. Moreover, by performing the cycle including Steps 1 and 2 a predetermined number of times, it is possible to form a high-quality Si film having a very small content of impurities such as Cl, C, and N at a low temperature range. Furthermore, as a result of intensive studies, the inventors found that when performing the cycle including Steps 1 and 2a a predetermined number of times, if a temperature of the wafer 200 was set to a temperature exceeding 450 degrees C., C of a concentration of 5% or more was observed in the Si film. In contrast, it was confirmed that it is possible to form a high-quality Si film having a very small content of impurities by setting a temperature of the wafer 200 to a temperature in the range of 300 to 450 degrees C., or more specifically, 350 to 450 degrees C.

Furthermore, the Si film formed by this film forming method becomes a dense film having a high wet-etching resistance to HF or the like, and is suitably used as an etching mask film or the like when etching the base SiO film or the like, for example, using HF. However, in this case, since the Si film is not an insulating film such as an SiO film or an SiN film, the Si film needs to be removed after, for example, use as an etching mask film.

(f) According to the film forming sequence of the embodiment, in Step 2, as an aminosilane-based precursor gas, the $SiH_3R$ gas with few amino groups included in the composition formula (per molecule) is used. Specifically, a precursor gas containing a single amino group in the composition formula (per molecule) is used. Thus, by using a precursor gas in which an amount of C and N containing in the composition is small as an aminosilane-based precursor gas, it becomes easy to reduce an amount of impurities such as C and N containing in the second layer to be formed in Step 2, and thus, in particular, it is possible to significantly reduce the amount of N.

(g) According to the film forming sequence of the embodiment, it is possible to form an Si film even at a low temperature range by the use of two precursors (silane source) of a chlorosilane-based precursor and an aminosilane-based precursor. Furthermore, according to the experiments of the inventors, when using only a chlorosilane-based precursor member, it was difficult to deposit Si on the wafer at a film forming rate that meets the production efficiency in the temperature range of 500 degrees C. or less. Furthermore, when using only an aminosilane-based precursor member, the deposition of Si onto the wafer was not confirmed in a temperature range of 500 degrees C. or less. However, according to the method of the embodiment, it is possible to form a high-quality Si film at a film forming rate that meets the production efficiency even in a low-temperature range of 500 degrees C. or less, for example, in a temperature range of 300 to 450 degrees C.

In addition, when the film forming temperature is set to a low-temperature, kinetic energy of the molecules is typically reduced, and it becomes difficult for a reaction or desorption of chlorine contained in the chlorosilane-based precursor or amine contained in the aminosilane-based precursor to occur, and thus these ligands remain on the wafer surface. Moreover, due to steric hindrance of the residual ligands, the adsorption of Si onto the wafer surface is inhibited, Si density decreases, and degradation of the film occurs. However, even under a condition in which it is hard for such reaction or desorption to progress, the residual ligands can be desorbed by allowing two silane sources, that is, a chlorosilane-based precursor and an aminosilane-based precursor to properly react with each other. Moreover, the steric hindrance is eliminated by desorption of the residual ligands, whereby it is possible to adsorb Si to an open site, thereby increasing the Si density. In this manner, it is possible to form a film having a high Si density even in a low-temperature range of 500 degrees C. or more, for example, in a temperature range of 300 to 450 degrees C.

(h) According to the embodiment, it is possible to form a high-quality Si film by a thermal reaction (thermochemical reaction) under a non-plasma atmosphere (without using plasma) at a low temperature range. Further, since it is possible to form an Si film without using plasma, the embodiment may be applied to a process having a probability of plasma damage.

(i) According to the embodiment, since it is possible to allow the reaction to appropriately progress under a condition in which the surface reaction progress is dominant by using an alternate supplying method of alternately supplying the chlorosilane-based precursor and the aminosilane-based precursor to the wafer 200, it is possible to improve the step coverage of the Si film. Further, it is possible to improve the controllability of the film thickness of the Si film.

(4) Modified Example

In the above-described film forming sequence shown in FIGS. 4 and 5A, an example, in which after a surface of the SiO film formed on the surface of the wafer 200 is treated, an Si film having a predetermined thickness is formed on a surface of a treated SiO film, i.e., on the seed layer by performing the cycle including Steps 1 and 2 a predetermined number of times, was described. However, the film forming sequence according to the embodiment may be varied as described later without being limited thereto.

Modified Example 1

Figure 6:
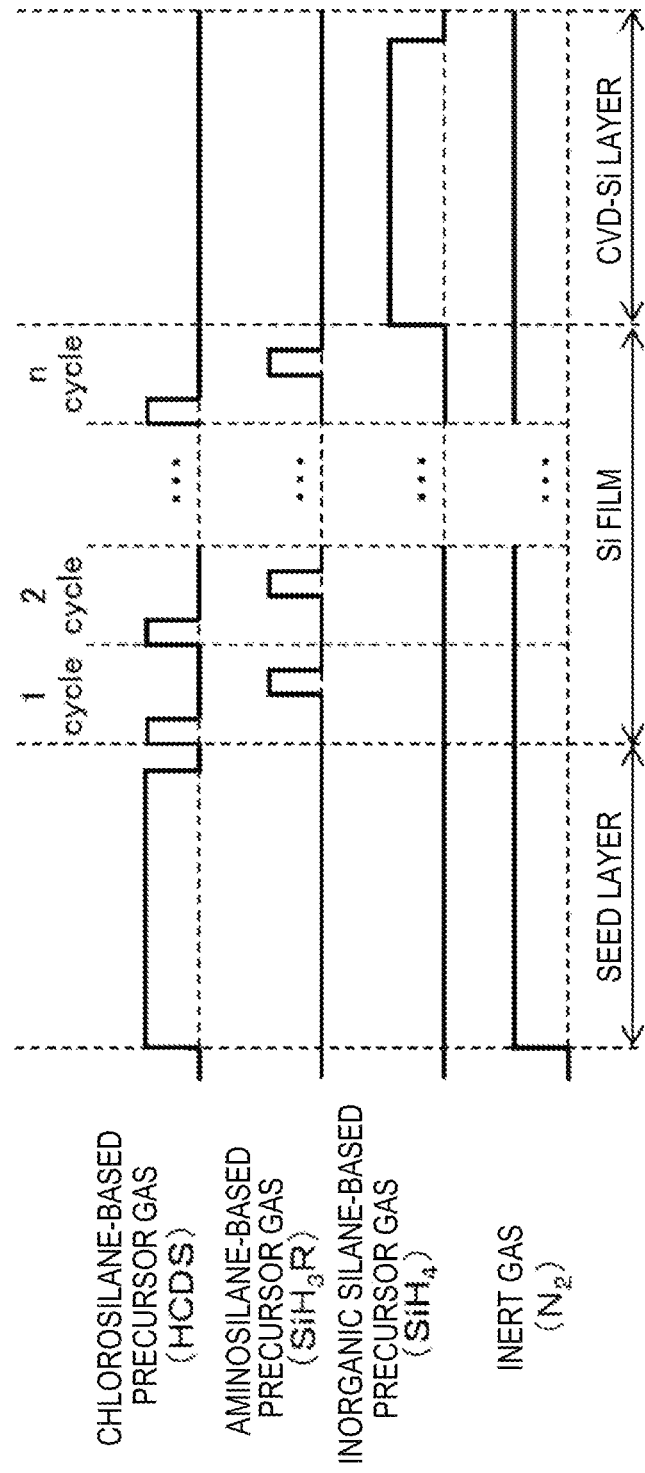
FIG. 6 is a diagram illustrating a gas supply timing in a second sequence of Modified Example 1 of an embodiment of the present disclosure.

For example, as shown in FIG. 6, after performing the seed layer forming step of the film forming sequence shown in FIGS. 4 and 5A, and the Si layer forming step by performing the cycle including Steps 1 and 2 a predetermined number of times (n times), a step of supplying an inorganic silane-based precursor gas (for example, $SiH_4$ gas) to the wafer 200 may be performed to form a CVD-Si layer by a chemical vapor deposition (CVD) method. Thus, it is possible to form an Si film constituted by the Si layer and the CVD-Si layer laminated in this order on a surface of a treated SiO film, i.e., on the seed layer.

In order to form a CVD-Si layer, the valve 243c of the third gas supply pipe 232c is opened to allow the flow of an $SiH_4$ gas as a fourth precursor into the third gas supply pipe 232c. A flow rate of the $SiH_4$ gas flowing into the third gas supply pipe 232c is adjusted by the MFC 241c. The flow rate-adjusted $SiH_4$ gas is supplied into the process chamber 201 through the gas supply holes 250c of the third nozzle 249c, and exhausted from the exhaust pipe 231. At this time, the $SiH_4$ gas is supplied to the wafer 200. At the same time, the valve 243g is opened to allow the flow of an inert gas such as $N_2$ gas into the inert gas supply pipe 232g. A flow rate of the $N_2$ gas flowing in the inert gas supply pipe 232g is adjusted by the MFC 241g. The flow rate-adjusted $N_2$ gas is supplied into the process chamber 201 together with the $SiH_4$ gas, and exhausted through the exhaust pipe 231.

Furthermore, at this time, in order to prevent infiltration of the $SiH_4$ gas into the first nozzle 249a and the second nozzle 249b, the valves 243e and 243f are opened to allow the flow of the $N_2$ gas into the first inert gas supply pipe 232e and the second inert gas supply pipe 232f. The $N_2$ gas is supplied into the process chamber 201 through the first gas supply pipe 232a, the second gas supply pipe 232b, the first nozzle 249a, and the second nozzle 249b, and exhausted through the exhaust pipe 231.

At this time, the APC valve 244 is appropriately adjusted to set the internal pressure of the process chamber 201 to fall within a range of, for example, 1 to 1000 Pa. A supply flow rate of the $SiH_4$ gas controlled by the MFC 241c is set to fall within a range of, for example, 1 to 1000 sccm. A supply flow rate of the $N_2$ gas controlled by each of the MFCs 241e to 241g is set to fall within a range of, for example, 100 to 10000 sccm. A temperature of the heater 207 is set such that a temperature of the wafer 200 falls within a range of, for example, 350 to 700 degrees. A CVD-Si layer having a predetermined thickness is formed on the Si layer by supplying the $SiH_4$ gas to the wafer 200 under the above-described conditions.

After the CVD-Si layer having a predetermined thickness is formed, the valve 243c of the third gas supply pipe 232c is closed to stop the supply of the $SiH_4$ gas. At this time, while the APC valve 244 of the exhaust pipe 231 is in an open state, the interior of the process chamber 201 is vacuum exhausted by the vacuum pump 246, and the $SiH_4$ gas remaining in the process chamber 201 which does not react or remains after contributing to the formation of the CVD-Si layer is removed from the process chamber 201. Furthermore, at this time, the valves 243e to 243g are in an open state, and the supply of the $N_2$ gas as an inert gas into the process chamber 201 is maintained. The $N_2$ gas acts as a purge gas, and thus, it is possible to increase an effect of removing the $SiH_4$ gas remaining in the process chamber 201 which does not react or remains after contributing to the formation of the CVD-Si layer from the process chamber 201.

Thus, an Si film is formed by sequentially laminating the Si layer and the CVD-Si layer on a surface of a treated SiO film, i.e., on the seed layer. Furthermore, by using an inorganic silane-based precursor gas containing no Cl, C, and N as a precursor gas, the CVD-Si layer may have very small amount of impurities such as Cl, C, and N. That is, the Si film becomes a film having a very small amount of impurities such as Cl, C, and N.

According to this modified example, since the seed layer and the Si layer are previously formed on the surface of the SiO film formed on the surface of the wafer 200, it is possible to improve a film thickness uniformity of the Si film in a plane of the wafer 200. If the Si film is directly formed on the surface of the SiO film by a CVD method, Si grows in an island shape on the surface of the SiO film at an initial stage of the Si film growth, resulting in a decrease of a film thickness uniformity of the Si film in a plane of the wafer 200. Also, in some cases, an incubation time of the Si film may increase, productivity may decrease, and the film forming cost may increase. In contrast, according to this modified example, by previously forming a seed layer and an Si layer on the surface of the SiO film, it is possible to avoid the growth of Si in an island shape at the initial stage of forming of the CVD-Si layer, thereby improving a film thickness uniformity of the Si film in a plane of the wafer 200. Further, it is also possible to shorten the incubation time of the Si film, thereby improving the productivity and reducing the film forming costs. Further, it is also possible to improve the film forming rate of the Si film by using a CVD method.

Furthermore, as an inorganic silane-based precursor gas, a polysilane gas ($Si_nH_{2n+2}$ (n>2)) gas such as a disilane ($Si_2H_6$) gas and a trisilane ($Si_3H_8$) gas may be used, in addition to the monosilane ($SiH_4$) gas. The polysilane gas may also be referred to as an inorganic silane-based precursor gas containing no Cl. As an inert gas, a rare gas such as an Ar gas, an He gas, an Ne gas, and a Xe gas may be used in addition to the $N_2$ gas.

Modified Example 2

Figure 7:
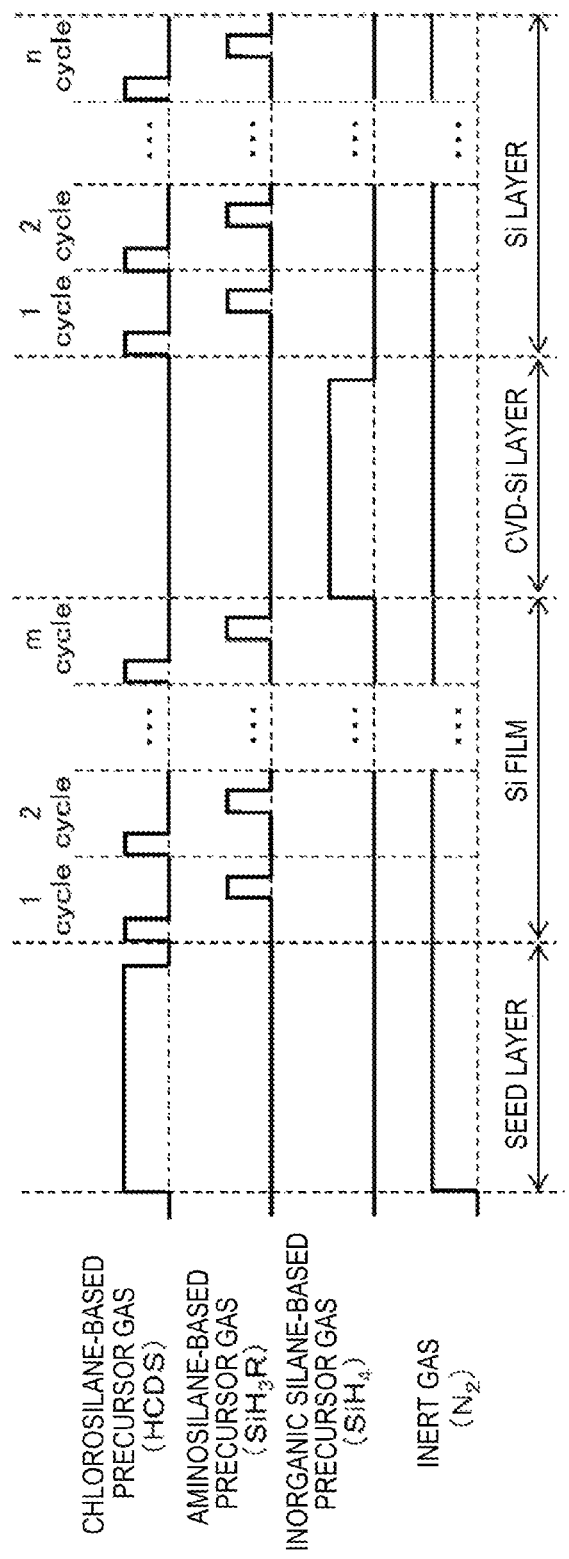
FIG. 7 is a diagram illustrating a gas supply timing in a second sequence of Modified Example 2 of an embodiment of the present disclosure.

For example, as shown in FIG. 7, after performing the seed layer forming step of the film forming sequence shown in FIGS. 4 and 5A, and the Si layer forming step by performing the cycle including Steps 1 and 2 a predetermined number of times (n times), a CVD-Si layer may be formed by a chemical vapor deposition (CVD) method using an inorganicsilane-based precursor gas (for example, $SiH_4$ gas), and then, an Si film may be formed by performing the cycle including Steps 1 and 2 of the film forming sequence shown in FIGS. 4 and 5A a predetermined number of times (n times). Thus, it is possible to form an Si film constituted by the Si layer, the CVD-Si layer, and the Si layer laminated in this order on a surface of a treated SiO film, i.e., on the seed layer.

Modified Example 3

Figure 8:
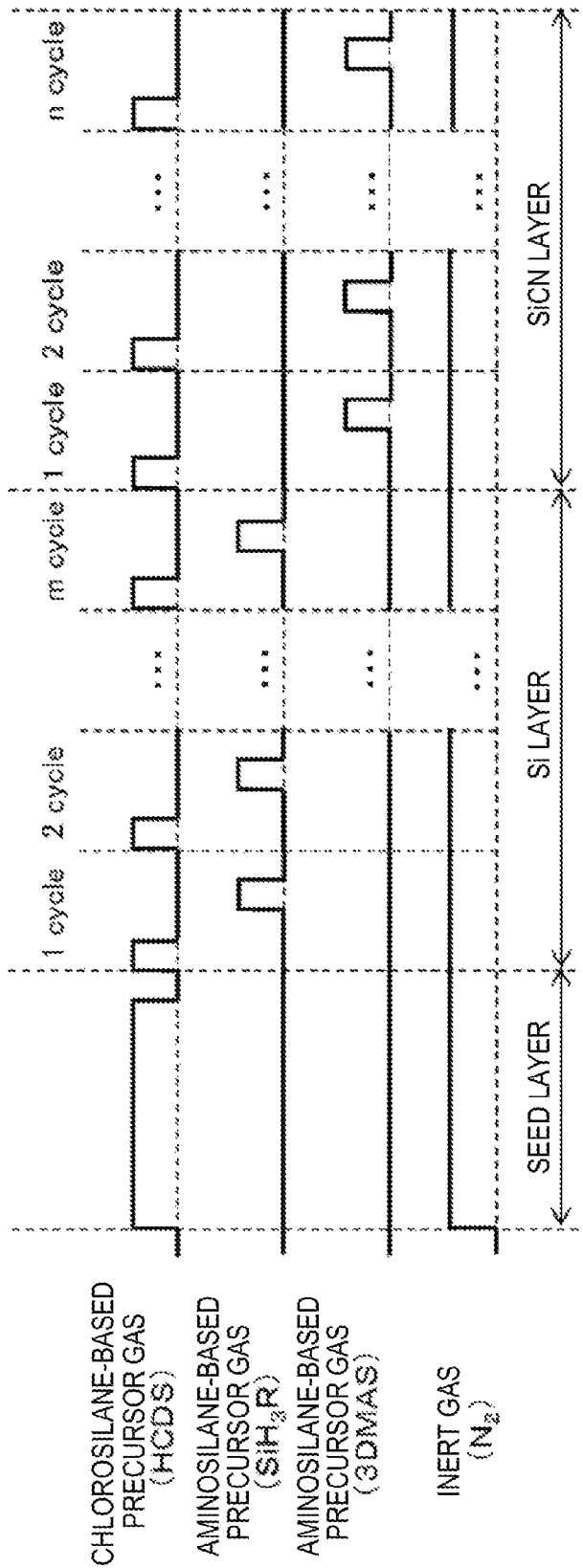
FIG. 8 is a diagram illustrating a gas supply timing in a second sequence of Modified Example 3 of an embodiment of the present disclosure.

Furthermore, for example, as shown in FIG. 8, after performing the seed layer forming step of the film forming sequence shown in FIGS. 4 and 5A and the Si layer forming step by performing the cycle including Steps 1 and 2 a predetermined number of times (n times), a silicon carbonitride layer (SiCN layer) may be formed by performing a cycle including Step 3 of supplying a chlorosilane-based precursor gas (for example, HCDS gas) to the wafer 200, and Step 4 of supplying an aminosilane-based precursor gas (for example, 3DMAS gas) to the wafer 200 a predetermined number of times (n times). Thus, it is possible to form a layer constituted by the Si layer and the SiCN layer laminated in this order on a surface of a treated SiO film, i.e., on the seed layer. That is, a laminated film constituted by laminating the Si film and the silicon carbonitride film (SiCN film) is formed. Hereinafter, Steps 3 and 4 will be described.

[Step 3]
(HCDS Gas Supply)

Step 3 of supplying the HCDS gas to the wafer 200 is performed by the same procedures and processing conditions as Step 1 of the film forming sequence shown in FIGS. 4 and 5A. However, the temperature of the wafer 200 is set to fall within a range of, for example, 250 to 700 degrees C., more specifically, 300 to 650 degrees C., or further more specifically, 350 to 600 degrees C. Thus, an Si-containing layer containing Cl which has a thickness of, for example, less than one atomic layer to several atomic layers is formed on the Si layer formed on the wafer 200.

(Residual Gas Removal)

After the Si-containing layer containing Cl is formed, and the HCDS gas remaining in the process chamber 201 which does not react or remains after contributing to the formation of the Si-containing layer or reaction byproducts are removed from the process chamber 201, by the same procedures and processing conditions as Step 1. At this time, in the same manner as Step 1, the gas remaining in the process chamber 201 may not be completely removed, and the interior of the process chamber 201 may not be completely purged.

[Step 4]
(3DMAS Gas Supply)

After Step 3 is terminated to remove the residual gas in the process chamber 201, the valve 243d of the fourth gas supply pipe 232d is opened to allow the flow of a 3DMAS gas as a fifth precursor into the fourth gas supply pipe 232d. A flow rate of the 3DMAS gas flowing into the fourth gas supply pipe 232d is adjusted by the MFC 241d. The flow rate-adjusted 3DMAS gas flows through the third gas supply pipe 232c. Then, the flow rate-adjusted 3DMAS gas is supplied into the process chamber 201 through the gas supply holes 250c of the third nozzle 249c, and exhausted from the exhaust pipe 231. At this time, the 3DMAS gas is supplied to the wafer 200. At the same time, the valve 243g is opened to allow the flow of an inert gas such as the $N_2$ gas into the inert gas supply pipe 232g. A flow rate of the $N_2$ gas flowing in the inert gas supply pipe 232g is adjusted by the MFC 241g. The flow rate-adjusted $N_2$ gas is supplied into the process chamber 201 together with the 3DMAS gas, and exhausted through the exhaust pipe 231.

Furthermore, at this time, in order to prevent infiltration of the 3DMAS gas into the first nozzle 249a and the second nozzle 249b, the valves 243e and 243f are opened to allow the flow of the $N_2$ gas into the first inert gas supply pipe 232e and the second inert gas supply pipe 232f. The $N_2$ gas is supplied into the process chamber 201 through the first gas supply pipe 232a, the second gas supply pipe 232b, the first nozzle 249a, and the second nozzle 249b, and exhausted through the exhaust pipe 231.

At this time, the APC valve 244 is appropriately adjusted to set the internal pressure of the process chamber 201 to fall within a range of, for example, 1 to 13300 Pa, more specifically, 20 to 1330 Pa. A supply flow rate of the 3DMAS gas controlled by the MFC 241d is set to fall within a range of, for example, 1 to 1000 sccm. A supply flow rate of the $N_2$ gas controlled by each of the MFCs 241e to 241g is set to fall within a range of, for example, 100 to 10000 sccm. A time of supplying the 3DMAS gas to the wafer 200, i.e., a gas supply time (irradiation time), is set to fall within a range of, for example, 1 to 120 seconds, or more specifically, 1 to 60 seconds. A temperature of the wafer 200 is set to fall within a range of, for example, 250 to 700 degrees C., more specifically, 300 to 650 degrees C., or further more specifically, 350 to 600 degrees C.

By supplying the 3DMAS gas to the wafer 200 under the above-described conditions, the Si-containing layer containing Cl formed on the Si layer on the wafer 200 in Step 1 reacts with the 3DMAS gas. Thus, the Si-containing layer containing Cl is modified into a layer containing Si, C, and N, i.e., an SiCN layer. The SiCN layer becomes a layer containing Si, C, and N with a thickness, for example, of less than one atomic layer to several atomic layers. Furthermore, the SiCN layer becomes a layer in which a ratio of an Si component and a ratio of a C component are relatively large, i.e., a layer being Si-rich and C-rich.

(Residual Gas Removal)

After the SiCN layer is formed, the valve 243d of the fourth gas supply pipe 232d is closed to stop the supply of the 3DMAS gas. At this time, while the APC valve 244 of the exhaust pipe 231 is in an open state, the interior of the process chamber 201 is vacuum exhausted by the vacuum pump 246, and the 3DMAS gas remaining in the process chamber 201 which does not react or remains after contributing to the formation of the SiCN layer is removed from the process chamber 201. Furthermore, at this time, the valves 243e to 243g are in an open state, and the supply of the $N_2$ gas as an inert gas into the process chamber 201 is maintained. The $N_2$ gas acts as a purge gas, and thus, it is possible to increase an effect of removing the HCDS gas remaining in the process chamber 201 which does not react or remains after contributing to the formation of the SiCN layer from the process chamber 201. At this time, in the same manner as Step 3, the gas remaining in the process chamber 201 may not be completely removed, and the interior of the process chamber 201 may not be completely purged.

(Performing Predetermined Number of Times)

By setting the above-described Steps 3 and 4 to one cycle and performing the cycle one or more times (a predetermined number of times), it is possible to form an SiCN layer having a predetermined thickness. Moreover, it is possible to form a layer constituted by lamination of the Si layer and the SiCN layer. In other words, a laminated film constituted by laminating the Si film and the SiCN film on a surface of a treated SiO film, that is, on the seed layer is formed.

Furthermore, as a chlorosilane-based precursor gas supplied in Step 3, an STC gas, a TCS gas, a DCS gas, an MCS gas and the like may be used in addition to the HCDS gas. Further, as an aminosilane-based precursor gas supplied in Step 4, a BDEAS gas, a BTBAS gas, a BDEPS gas, a 3DEAS gas, a 4DEAS gas, a 4DMAS gas and the like may be used in addition to the 3DMAS gas. As an inert gas, a rare gas such as Ar gas, He gas, Ne gas, and Xe gas may be used in addition to the $N_2$ gas.

Other Embodiments of the Present Disclosure

While some embodiments of the present disclosure have been described in detail, the present disclosure is not limited to the above-described embodiments but can be variously modified without departing from the scope thereof.

For example, in the above-described embodiments, an example in which an SiO film serving as a semiconductor oxide film is formed on the surface of the wafer 200, as the insulating film has been described, but the present disclosure is not limited to such embodiments. For example, as the insulating film, a semiconductor nitride film such as a silicon nitride film ($Si_3N_4$ film, hereinafter also referred to as an SiN film), a semiconductor oxynitride film such as a silicon oxynitride film (SiON film), a semiconductor oxycarbide film such as a silicon oxycarbide film (SiOC film), a semiconductor oxycarbonitride film such as silicon oxycarbonitride film (SiOCN film) may be formed on the surface of the wafer 200. Further, for example, a metal oxide film such as an aluminum oxide film ($Al_2O_3$ film, hereinafter, also referred to as an AlO film), a titanium oxide film ($TiO_2$ film, hereinafter, also referred to as a TiO film), a hafnium oxide film ($HfO_2$ film, hereinafter, also referred to as an HfO film) a zirconium oxide film ($ZrO_2$ film, hereinafter, also referred to as a ZrO film), a ruthenium oxide film ($Ru_2O$ film, hereinafter, also referred to as a RuO film), and a tungsten oxide film ($WO_3$ film, hereinafter, also referred to as a WO film), and a metal nitride film such as a titanium nitride film (TiN film) may be formed on the surface of the wafer 200. In addition, for example, a metal oxynitride film such as a titanium oxynitride film (TiON film), a metal oxycarbide film such as a titanium oxycarbide film (TiOC film), a metal oxycarbonitride film such as a titanium oxycarbonitride film (TiOCN film) and the like may be formed on the surface of the wafer 200. Furthermore, the oxide film (or nitride film, oxynitride film, oxycarbide film, oxycarbonitride film) herein includes a CVD oxide film formed, for example, by a CVD method, an oxide film formed by performing a predetermined process, such as, for example, thermal oxidation process or plasma oxidation process to intentionally oxide the surface of the wafer 200, and a natural oxide film naturally formed on the surface of the wafer 200 by being exposed to air during transfer.

Furthermore, as a result of intensive studies, the inventors found that in particular, if the insulating film is a film containing O, especially, the SiO film, the above-described problems may occur. That is, a film thickness uniformity of the Si film formed on the insulating film in a plane of the wafer 200 is easily reduced, the step coverage easily decreases, or the incubation time easily increases. In other words, it has been found that if the insulating film formed on the surface of the wafer 200 is a film containing O, especially, the SiO film, the effect of the above-described treatment process can be particularly remarkably achieved.

Further, for example, in the above-described embodiments, while an example of using a chlorosilane-based precursor as the first precursor and the second precursor, respectively has been described, a silane-based precursor having halogen-based ligands other than a chloro group may be used instead of the chlorosilane-based precursor. For example, a fluorosilane-based precursor may be used instead of the chlorosilane-based precursor. Here, the fluorosilane-based precursor is a silane-based precursor having a fluoro group as a halogen group, and a precursor containing at least silicon (Si) and fluorine (F). In other words, the fluorosilane-based precursor herein may also be referred to as a kind of halide. As a fluorosilane-based precursor gas, it is possible to use, for example, a silicon fluoride gas such as a tetrafluorosilane, i.e., silicontetrafluoride ($SiF_4$) gas or a hexafluorodisilane ($Si_2F_6$) gas. In this case, the seed layer is a layer containing F as a halogen group, and more specifically, a layer containing F as a halogen group and Si as a predetermined element. Further, the first layer is a layer containing Si and F, that is, an Si-containing layer containing F. However, a chlorosilane-based precursor may be used as a silane-based precursor having a halogen group, in view of the vapor pressure of the precursor or the vapor pressure of the reaction product produced in Step 2.

Further, for example, in the above-described embodiments, while an example of using the HCDS gas as the first precursor and the second precursor, respectively, that is, an example in which the first precursor and the second precursor consist of the same substances has been described, the present disclosure is not limited to such embodiments. For example, the present disclosure can be suitably applied even in the case of using the HCDS gas as the first precursor and the DCS gas as the second precursor, or in the case of using the DCS gas as the first precursor and the HCDS gas as the second precursor. Further, the present disclosure can be suitably applied, for example, in the case of using a chlorosilane-based precursor as the first precursor and a fluorosilane-based precursor as the second precursor, or in the case of using a fluorosilane-based precursor as the first precursor and a chlorosilane-based precursor as the second precursor. That is, the present disclosure can be suitably applied even if the first precursor and the second precursor consist of different substances.

Further, for example, in the above-described embodiment, while an example of performing the treatment process and the Si film forming process in the same process chamber 201 has been described, the present disclosure is not limited to such embodiments. That is, the treatment process and the Si film forming process may be independently performed in respective process chambers. In this case, the processing conditions in the treatment process and the processing conditions in the Si film forming process may be varied in a wider range than the above-described embodiments. For example, it is possible to more efficiently perform the formation of the seed layer by setting temperature conditions (temperature of the wafer 200) in the Si film forming process to be higher than temperature conditions (temperature of the wafer 200) in the treatment process.

Further, for example, in the above-described embodiment, while an example of forming a seed layer on the surface of the SiO film formed on the surface of the wafer 200 in the treatment process has been described, the present disclosure is not limited to such embodiments. For example, pre-processing (Cl terminating) of the surface of the SiO film formed on the surface of the wafer 200 may be performed in the treatment process by supplying a hydrogen chloride gas (HCl gas), a chlorine gas ($Cl_2$ gas) or the like to the wafer 200 with the SiO film formed on the surface. That is, in the treatment process, Cl terminated surface of the SiO film may be formed rather than forming a seed layer on the surface of the SiO film. In this case, it is possible to obtain the effect of the same tendency as the above-described embodiment by setting a temperature of the wafer 200 in the treatment process to a relatively high temperature, for example, to a temperature higher than a temperature of the wafer 200 in the Si film forming process.

Further, for example, in the above-described embodiment, as shown in FIG. 5A, while an example of supplying a chlorosilane-based precursor to the wafer 200 in the treatment process, supplying a chlorosilane-based precursor to the wafer 200 in the Si film forming process, and then supplying an aminosilane-based precursor has been described, in this case, a residual gas removal step in the treatment process may not be provided. That is, as shown in FIG. 5B, an HCDS gas supply step in the treatment process and Step 1 of the first cycle in the Si film forming process may be continuously performed rather than between the residual gas removal steps. In this case, since the residual gas removal step may not be provided, it is possible to improve the throughput of the film forming process. However, by performing the residual gas removal step in the treatment process, it is possible to separate Step 1 of the treatment process and the Si film forming process, whereby it is possible to independently set the processing conditions in the treatment process (flow rate of HCDS gas, internal pressure of the process chamber 201 and the like), thereby facilitating the control of the forming rate, thickness, or composition of the seed layer. Furthermore, when changing a point of view, the film forming sequence shown in FIG. 5B can be considered that a gas supply time of the HCDS gas in Step 1 of the first cycle of the Si film forming process is set to be longer than a gas supply time of the HCDS gas in Step 1 after the second cycle.

Further, for example, in the above-described embodiment, while an example of supplying a chlorosilane-based precursor to the wafer 200 in the Si film forming process and then supplying an aminosilane-based precursor has been described, the supply order of these precursors may be reversed. That is, the chlorosilane-based precursor may be supplied after supplying the aminosilane-based precursor. That is, one of the chlorosilane-based precursor and the aminosilane-based precursor may be supplied, and then the other thereof may be supplied. Thus, by changing the order of supplying the precursor, it is also possible to vary the quality of the thin film to be formed. Further, in the case of supplying the aminosilane-based precursor and then supplying the chlorosilane-based precursor, since the above-described modification process is performed on the seed layer during supply of the aminosilane-based precursor at the first cycle, it is possible to reduce the content of impurities such as Cl, C, and N containing in the seed layer.

Further, for example, in the above-described embodiment, while an example of using monoaminosilane ($SiH_3R$) as a third precursor (aminosilane-based precursor) in the Si film forming process has been described, the present disclosure is not limited to such examples. That is, as a third precursor, organic precursors, such as for example, diaminosilane ($SiH_2RR'$), triaminosilane ($SiHRR'R''$), tetraminosilane ($SiRR'R''R'''$) and the like may be used. That is, as a third precursor, a precursor containing two, three, or four amino groups in the composition formula (In one molecule) may be used. Thus, even if a precursor containing a plurality of amino groups in the composition formula (In one molecule) is used as a third precursor, it is possible to form an Si film with a small content of impurities such as C and N at a low temperature range.

However, the smaller the number of amino groups included in the composition formula of the third precursor is, that is, the smaller the amount of C or N contained in the composition is, the easier to reduce the amount of impurities such as C or N contained in the first layer, and the easier to form an Si film with a very small content of impurities. That is, when SiH₃R, SiH₂RR' or SiHRR'R" is used as a third precursor rather than SiRR'R"R'", it becomes easy to reduce the amount of impurities contained in the Si film. Also, when SiH₃R or SiH₂RR' is used as a third precursor rather than SiHRR'R", it becomes easy to reduce the amount of impurities contained in the Si film. Furthermore, when SiH₃R is used as a third precursor rather than SiH₂RR', it becomes easy to reduce the amount of impurities contained in the Si film.

Furthermore, in the above-described embodiment, while an example of forming an Si film on a surface of a treated SiO film by performing the cycle including the chlorosilane-based precursor gas supply step and the aminosilane-based precursor gas supply step a predetermined number of times has been described, the present disclosure is not limited to such examples.

For example, the present disclosure can also be applied to the following cases: a case of forming an SiN film on a surface of a treated SiO film by performing a cycle including a chlorosilane-based precursor gas supply step and a nitrogen-containing gas supply step a predetermined number of times; a case of forming an SiO film on a surface of a treated SiO film by performing a cycle including a chlorosilane-based precursor gas supply step and an oxygen-containing gas supply step a predetermined number of times; a case of forming an SiO film on a surface of a treated SiO film by performing a cycle including a chlorosilane-based precursor gas supply step and a step of supplying a gas obtained by adding a hydrogen-containing gas to an oxygen-containing gas a predetermined number of times; or a case of forming an SiO film on a surface of a treated SiO film by performing a cycle including a chlorosilane-based precursor gas supply step, a nitrogen-containing gas supply step, and an oxygen-containing gas supply step a predetermined number of times.

Furthermore, for example, the present disclosure can also be applied to the following cases: a case of forming an SiCN film on a surface of a treated SiO film by performing a cycle including a chlorosilane-based precursor gas supply step, a carbon-containing gas supply step, and a nitrogen-containing gas supply step a predetermined number of times; or a case of forming an SiOCN film on a surface of a treated SiO film by performing a cycle including a chlorosilane-based precursor gas supply step, a carbon-containing gas supply step, a nitrogen-containing gas supply step, and an oxygen-containing gas supply step a predetermined number of times.

In addition, for example, the present disclosure can also be applied to the following cases: a case of forming an SiCN film on a surface of a treated SiO film by performing a cycle including a chlorosilane-based precursor gas supply step and an amine-based gas supply step a predetermined number of times; or a case of forming an SiOCN film on a surface of a treated SiO film by performing a cycle including a chlorosilane-based precursor gas supply step, an amine-based gas supply step, and an oxygen-containing gas supply step a predetermined number of times.

Also, for example, the present disclosure can also be applied to the following cases: a case of forming an SiBN film on a surface of a treated SiO film by performing a cycle including a chlorosilane-based precursor gas supply step, a boron-containing gas supply step, and a nitrogen-containing gas supply step a predetermined number of times; or a case of forming an SiBCN film on a surface of a treated SiO film by performing a cycle including a chlorosilane-based precursor gas supply step, a carbon-containing gas supply step, a boron-containing gas supply step, and a nitrogen-containing gas supply step a predetermined number of times.

Furthermore, for example, the present disclosure can also be applied to the following cases: a case of forming an SiBCN film having a borazine ring structure on a surface of a treated SiO film by performing a cycle including a chlorosilane-based precursor gas supply step and an organic borazine-based gas supply step a predetermined number of times; or a case of forming an SiBCN film or an SiBN film having a borazine ring structure on a surface of a treated SiO film by performing a cycle including a chlorosilane-based precursor gas supply step, an organic borazine-based gas supply step, and a nitrogen-containing gas supply step a predetermined number of times.

In these cases, as a nitrogen-containing gas, it is possible to use, for example, an ammonia ($NH_3$) gas, a diazene ($N_2H_2$) gas, a hydrazine ($N_2H_4$) gas, an $N_3H_8$ gas, a gas containing these compounds or the like.

As an oxygen-containing gas, it is possible to use, for example, an oxygen ($O_2$) gas, a nitrous oxide ($N_2O$) gas, a nitrogen monoxide (NO) gas, a nitrogen dioxide ($NO_2$) gas, an ozone ($O_3$) gas, a water vapor ($H_2O$) gas, a carbon monoxide (CO) gas, a carbon dioxide ($CO_2$) gas or the like. As a gas obtained by adding a hydrogen-containing gas (reducing gas) to the oxygen-containing gas, it is possible to use, for example, $O_2$ gas+$H_2$ gas, $O_3$ gas+H2 gas or the like.

As a carbon-containing gas, it is possible to use, for example, a hydrocarbon-based gas such as an acetylene ($C_2H_2$) gas, a propylene ($C_3H_6$) gas, and an ethylene ($C_2H_4$) gas, that is, a carbon-containing gas containing no nitrogen.

As an amine-based gas, it is possible to use an ethylamine-based gas obtained by vaporizing triethylamine (($C_2H_5$)$_3$N, abbreviation: TEA), a diethylamine (($C_2H_5$)$_2$NH, abbreviation: DEA), a monoethylamine ($C_2H_5NH_2$, abbreviation: MEA) and the like, a methylamine-based gas obtained by vaporizing trimethylamine (($CH_3$)$_3$N, abbreviation: TMA), a dimethylamine (($CH_3$)$_2$NH, abbreviation: DMA), a monomethylamine ($CH_3NH_2$, abbreviation: MMA) and the like, a propylamine-based gas obtained by vaporizing tripropylamine (($C_3H_7$)$_3$N, abbreviation: TPA), a dipropylamine (($C_3H_7$)$_2$NH, abbreviation: DPA), a monopropylamine ($C_3H_7NH_2$, abbreviation: MPA) and the like, an isopropyl amine-based gas obtained by vaporizing triisopropylamine ([($CH_3$)$_2$CH]$_3$N, abbreviation: TIPA), diisopropylamine ([($CH_3$)$_2$CH]$_2$NH, abbreviation: DIPA), monoisopropylamine (($CH_3$)$_2$CHNH$_2$, abbreviation: MIPA) and the like, a butylamine-based gas obtained by vaporizing tributylamine (($C_4H_9$)$_3$N, abbreviation: TBA), dibutylamine (($C_4H_9$)$_2$NH, abbreviation: DBA), monobutylamine ($C_4H_9NH_2$, abbreviation: MBA) and the like, an isobutylamine-based gas obtained by vaporizing triisobutylamine ([($CH_3$)$_2$CHCH$_2$]$_3$N, abbreviation: TIBA), diisobutylamine ([($CH_3$)$_2$CHCH$_2$]$_2$NH, abbreviation: DIBA), monoisobutylamine (($CH_3$)$_2$CHCH$_2$NH$_2$, abbreviation: MIBA) and the like. That is, as the amine-based gas, it is possible to use at least one of the gases containing, for example, $(C_2H_5)_xNH_{3-x}$, $(CH_3)_xNH_{3-x}$, $(C_3H_7)_xNH_{3-x}$, $[(CH_3)_2CH]_xNH_{3-x}$, $(C_4H_9)_xNH_{3-x}$, and $[CH_3)_2CHCH_2]_xNH_{3-x}$ (x is an integer from 1 to 3 in the chemical formula).

Furthermore, it is also possible to use an organic hydrazine-based gas instead of the amine-based gas. As the organic hydrazine-based gas, it is possible to use, for example, a methyl hydrazine-based gas obtained by vaporizing monomethylhydrazine (($CH_3$)HN$_2$H$_2$, abbreviation: MMH), dimethylhydrazine (($CH_3$)$_2$N$_2$H$_2$, abbreviation: DMH), trimethylhydrazine (($CH_3$)$_2$N$_2$($CH_3$)H, abbreviation; TMH) and the like, or an ethylhydrazine-based gas obtained by vaporizing ethylhydrazine (($C_2H_5$)HN$_2$H$_2$, abbreviation: EH) and the like.

As the boron-containing gas, it is possible to use, for example, a halogenated boron-based gas such as a boron trichloride (BCl$_3$) gas and boron trifluoride gas (BF$_3$) gas, an inorganic borane-based gas such as diborane (B$_2$H$_6$) gas, and an organic borazine-based gas. As the organic borazine-based gas, it is possible to use, for example, an organic borazine compound gas such as an n, n', n"-trimethylborazine (abbreviation: TMB) gas.

As the chlorosilane-based precursor gas, it is possible to use the same gas in the above-described embodiments. Furthermore, the processing conditions at this time may be set to the same processing conditions as the above-described embodiment. However, the temperature of the wafer 200 may be set to fall within a range of, for example, 250 to 700 degrees C., more specifically, 300 to 650 degrees C., or further more specifically, 350 to 600 degrees C.

Thus, it is possible to appropriately apply the present disclosure to a substrate processing process using a chlorosilane-based precursor gas and a nitrogen-containing gas, a substrate processing process using a chlorosilane-based precursor gas and an oxygen-containing gas, a substrate processing process using a chlorosilane-based precursor gas and a hydrogen-containing gas, a substrate processing process using a chlorosilane-based precursor gas and a carbon-containing gas, a substrate processing process using a chlorosilane-based precursor gas and a carbon-containing or nitrogen-containing gas, a substrate processing process using a chlorosilane-based precursor gas and a boron-containing gas or the like. That is, the present disclosure can be applied to the overall substrate processing process using at least one of a nitrogen-containing gas (nitriding gas), an oxygen-containing gas (oxidizing gas), a hydrogen-containing gas (reducing gas), a carbon-containing gas (hydrocarbon-based gas), a carbon and nitrogen-containing gas (amine-based gas, organic hydrazine gas), and a boron-containing gas (halogenated boron-based gas, inorganic borazine-based gas, organic borazine-based gas), as a third precursor. That is, the present disclosure can be applied to the overall substrate treatment process of forming a film on the SiO film using a chlorosilane-based precursor gas.

Further, it is possible to provide a device forming technique having excellent workability by using an Si film, an Si-based insulating film, or a B-based insulating film formed by the method of the embodiment as an etching stopper. Furthermore, an Si film formed by the method of the embodiment can be appropriately applied to various applications such as a floating gate electrode or a control gate electrode of a semiconductor memory device, channel silicon, a gate electrode of a transistor, a capacitor electrode of a DRAM, an STI liner, and a solar cell. Further, by the use of an Si-based insulating film or a B-based insulating film formed by the method of the embodiment as a side wall spacer, it is possible to provide a device forming technique with small leakage current and having excellent workability.

According to the above-described embodiments or modified examples, it is possible to form an Si film, an Si-based insulating film, and a B-based insulating film of an ideal stoichiometric ratio without using plasma even at a low temperature range. Further, since it is possible to form an Si film, an Si-based insulating film, and a B-based insulating film without using plasma, the embodiment may be applied to a process having probability of plasma damage, for example, an SADP film of DPT.

Furthermore, in the above-described embodiment, an example of forming an Si film containing silicon, which is a semiconductor element, as a thin film containing a predetermined element has been described, but the present disclosure can be applied to a case of forming a metal-based thin film containing a metal element such as titanium (Ti), zirconium (Zr), hafnium (Hf), tantalum (Ta), aluminum (Al), molybdenum (Mo) or the like.

In this case, it is possible to form a film by the same film forming sequence as in the above-described embodiments, by using a precursor (second precursor) containing a metal element and a halogen group instead of the chlorosilane-based precursor in the above-described embodiment, and by using a precursor (third precursor) containing a metal element and a halogen group instead of the aminosilane-based material. As the second precursor, it is possible to use, for example, a precursor containing a metal element and a chloro group, or a precursor containing a metal element and a fluoro group.

In this case, the following processes are performed: a process of performing treatment on a surface of an insulating film by supplying a first precursor containing a metal element and a halogen group to the wafer 200 with an insulating film formed on the surface; and a process of forming a metal-based thin film containing a metal element on a surface of a treated insulating film by performing a cycle including a step of supplying a second precursor containing the metal element and the halogen group to the wafer 200, and a step of supplying a third precursor to the wafer 200 a predetermined number of times.

For example, when a Ti film that is a Ti-based thin film composed of Ti is formed as a metal-based thin film, as a first precursor and a second precursor, it is possible to use a precursor containing Ti and a chloro group such as titanium tetrachloride (TiCl$_4$), or a precursor containing Ti and a fluoro group such as titanium tetrafluoride (TiF$_4$). As the third precursor, it is possible to use a precursor containing Ti and an amino group such as tetrakis(ethylmethylamino)titanium (Ti[N(C$_2$H$_5$)(CH$_3$)]$_4$, abbreviation: TEMAT), tetrakis(dimethylamino)titanium (Ti[N(CH$_3$)$_2$]$_4$, abbreviation: TDMAT), or tetrakis(diethylamido)titanium (Ti[N(C$_2$H$_5$)$_2$]$_4$, abbreviation: TDEAT). Further, as the third precursor, it is also possible to use a precursor containing Ti and an amino group in which the number of ligands containing an amino group in the composition formula is 2 or less, and equal to or less than the number of ligands containing a halogen group in the composition formula of the second precursor. Furthermore, as the third precursor, a precursor containing a single amino group in the composition formula may be used. Furthermore, the processing conditions at this time may be the same processing conditions as the above-described embodiment.

When a Zr film that is a Zr-based thin film composed of Zr is formed as a metal-based thin film, as a first precursor and a second precursor, it is possible to use a precursor containing Zr and a chloro group such as zirconium tetrachloride (ZrCl$_4$), or a precursor containing Zr and a fluoro group such as zirconium tetrafluoride (ZrF$_4$). As the third precursor, it is possible to use a precursor containing Zr and an amino group such as tetrakis(ethylmethylamino)zirconium (Zr[N(C$_2$H$_5$)(CH$_3$)]$_4$, abbreviation: TEMAZ), tetrakis(dimethylamino)zirconium (Zr[N(CH$_3$)$_2$]$_4$, abbreviation: TDMAZ), or tetrakis(diethylamino)zirconium (Zr[N(C$_2$H$_5$)$_2$]$_4$, abbreviation: TDEAZ). Further, as the third precursor, it is also possible to use a precursor containing Zr and an amino group in which the number of ligands containing an amino group in the composition formula is 2 or less, and equal to or less than the number of ligands containing a halogen group in the composition formula of the second precursor. Furthermore, as the third precursor a precursor containing a single amino group in the composition formula may be used. Furthermore, the processing conditions at this time may be the same processing conditions as the above-described embodiment.

Also, when an Hf film that is an Hf-based thin film composed of Hf is formed as a metal-based thin film, as a first precursor and a second precursor, it is possible to use a precursor containing Hf and a chloro group such as hafnium tetrachloride ($HfCl_4$), or a precursor containing Hf and a fluoro group such as hafnium tetrafluoride ($HfF_4$). As the third precursor, it is possible to use a precursor containing Hf and an amino group, such as, tetrakis(ethylmethylamino)hafnium ($Hf[N(C_2H_5)(CH_3)]_4$, abbreviation: TEMAH), tetrakis(dimethylamino)hafnium ($Hf[N(CH_3)_2]_4$, abbreviation: TDMAH), or tetrakis(diethylamido)hafnium ($Hf[N(C_2H_5)_2]_4$, abbreviation: TDEAH). Further, as the third precursor, it is also possible to use a precursor containing Hf and an amino group in which the number of ligands containing an amino group in the composition formula is 2 or less, and equal to or less than the number of ligands containing a halogen group in the composition formula of the second precursor. Furthermore, as the third precursor, a precursor containing a single amino group in the composition formula may be used. Furthermore, the processing conditions at this time may be set to the same processing conditions as the above-described embodiment.

Furthermore, even in these cases, it is possible to form various metal-based thin films such as a metal-based nitride film, a metal-based oxide film, a metal-based oxynitride film, and a metal-based oxycarbonitride film, by using a gas including at least one of a nitrogen-containing gas, an oxygen-containing gas, a hydrogen-containing gas, a carbon-containing gas, a carbon and nitrogen-containing gas, and a boron-containing gas as a third precursor.

Thus, the present disclosure can be also applied not only to a semiconductor-based thin film but to film formation of a metal-based thin film, and the effects of the same tendency as the above-described embodiment can be obtained even in this case.

Furthermore, each of process recipes (programs in which processing procedures and processing conditions are written) used for forming various thin films may be individually prepared (prepared in the plural number), depending the contents of the substrate processing (a film type of a thin film to be formed, a composition ratio, a film quality, a film thickness or the like). Moreover, when starting the substrate processing, an appropriate process recipe may be appropriately selected from the plurality of process recipes, depending on the contents of the substrate processing. Specifically, the plurality of process recipes individually prepared depending on the contents of the substrate processing may be stored (installed) in the storage device 121c provided in the substrate processing apparatus in advance, through a telecommunication line or a recording medium (external storage device 123) storing the process recipe. Moreover, when starting the substrate processing, the CPU 121a provided in the substrate processing apparatus appropriately select the proper process recipe from the plurality of process recipes stored in the storage device 121c, depending on the contents of the substrate processing. With such a configuration, it is possible to form thin films of various film types, composition ratios, film qualities, and film thicknesses in one substrate processing apparatus for general purpose with good reproducibility. Further, it is possible to reduce the operation load of an operator (input load such processing procedures and processing conditions), thereby quickly starting the substrate processing, while avoiding erroneous operation.

However, the above-described process recipe is not limited to the case of being newly created but may be prepared, for example, by changing the existing process recipes previously installed in the substrate processing apparatus. When the process recipe is changed, the changed process recipe may be installed in the substrate processing apparatus via an electric communication line or a recording medium storing the process recipe. Further, the existing process recipe previously installed in the substrate processing apparatus may be directly changed by operating the input/output device 122 provided in the existing substrate processing apparatus.

Furthermore, in the above-described embodiment, an example of forming a thin film using a batch type substrate processing apparatus configured to process a plurality of substrates at a time has been described, but the present disclosure is not limited thereto but can also be appropriately applied to a case of forming a thin film using a single-wafer type substrate processing apparatus in which one or several substrates are processed at a time. Furthermore, in the above-described embodiment, an example of forming a thin film using a substrate processing apparatus having a hot wall type processing furnace has been described, but the present disclosure is not limited thereto but can also be appropriately applied to a case of forming a thin film using a substrate processing apparatus having a cold wall type processing furnace.

Furthermore, the above-described embodiments, modified and the like may be used appropriately combined and used.

EXAMPLES

As an example, the treatment process was performed on the wafers with an insulating film (SiO film) formed on a surface by performing the film forming sequence shown in FIGS. 4 and 5A using the above-described substrate processing apparatus. Thereafter, a process of forming an Si film on the surface of the treated SiO film i.e., on a seed layer was performed. The HCDS gas was used as the first precursor and the second precursor, and the $SiH_3R$ gas was used as the third precursor. A wafer temperature at the time of forming the film was set to 450 degrees C. In addition, a pressure in the process chamber in the treatment process was set to be higher than a pressure in the process chamber during supply of the HCDS gas in the Si film forming process. Other processing conditions were set to a predetermined value within the processing condition range described in the above-described example. Furthermore, as a comparative example, an Si film was directly formed on an SiO film by performing a cycle including an HCDS gas supply process and an $SiH_3R$ gas supply process a predetermined number of times without performing the treatment processing on the wafer with the SiO film formed on the surface. The comparative example is different from the example only in that the treatment process is not performed on the SiO film as a base of the formation of the Si film, and other processing procedures and processing conditions were set to be the same as in the example. Moreover, the film forming rates of the Si film according to the example and the Si film according to the comparative example were measured, respectively, and the results are shown in FIG. 9.

Figure 9:
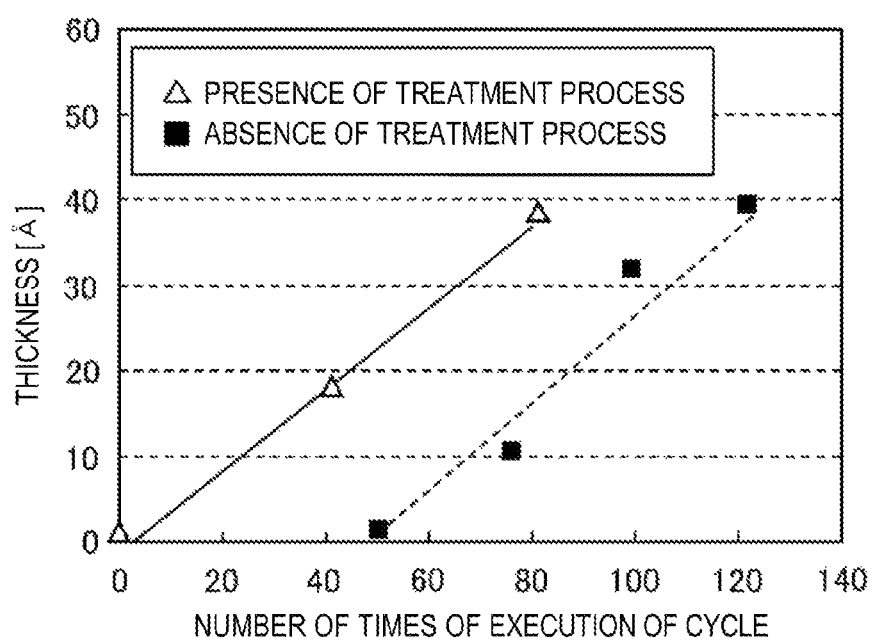
FIG. 9 is a graph illustrating an aspect in which an incubation time is reduced by performing a treatment process.

FIG. 9 is a graph showing measurement results of the film forming rate of the Si film according to the example and the comparative example. A horizontal axis of FIG. 9 represents the number of times of execution of the cycle [times], and the vertical axis represents a film thickness [Å] of the Si film. Furthermore, the mark "Δ" of FIG. 9 represents a thickness of an Si film according to the example, and the mark "■" represents a film thickness of the Si film according to the comparative example.

As shown in FIG. 9, it was confirmed that the forming of the Si film according to the example is started from an early stage (from the first cycle) than the forming of the Si film according to the comparative example. Further, it was confirmed that in the Si film according to the comparative example, the growth of the Si film was not initiated until the cycle was repeated 50 times, and the growth is initiated finally from around when the number of times of execution of the cycle exceeds 50 times. That is, it was confirmed that it is possible to significantly reduce the incubation time during film formation by performing the treatment processing on the wafer with the SiO film formed on the surface before starting the Si film forming process, thereby increasing the productivity and reducing the film forming costs.

Aspects of Present Disclosure

Hereinafter, some aspects of the present disclosure will be additionally stated.

(Supplementary Note 1)

According to an aspect of the present disclosure, there is provided a method of manufacturing a semiconductor device, including: treating a surface of an insulating film formed on a substrate by supplying a first precursor containing a predetermined element and a halogen group to the substrate; and forming a thin film containing the predetermined element on the treated surface of the insulating film by performing a cycle a predetermined number of times, the cycle including supplying a second precursor containing the predetermined element and a halogen group to the substrate and supplying a third precursor to the substrate.

(Supplementary Note 2)

In some embodiments, a supply time of the first precursor is set to be longer than a gas supply time of the second precursor per the cycle.

(Supplementary Note 3)

In some embodiments, the supply time of the first precursor is set to fall within a range of 120 to 1200 second.

(Supplementary Note 4)

In some embodiments, the supply time of the first precursor is set to fall within a range of 300 to 900 second.

(Supplementary Note 5)

In some embodiments, the supply time of the first precursor is set to fall within a range of 600 to 900 second.

(Supplementary Note 6)

In some embodiments, a flow rate of first precursor is set to be greater than a flow rate of the second precursor.

(Supplementary Note 7)

In some embodiments, a pressure of a space where the substrate exists when supplying the first precursor is set to be higher than a pressure of a space where the substrate exists when supplying the second precursor.

(Supplementary Note 8)

In some embodiments, the first precursor and the second precursor consists of the same substance.

(Supplementary Note 9)

In some embodiments, in the act of treating the surface of the insulating film, a seed layer is formed on the surface of the insulating film.

(Supplementary Note 10)

In some embodiments, in the act of treating the surface of the insulating film, a seed layer containing the halogen group is formed on the surface of the insulating film.

(Supplementary Note 11)

In some embodiments, in the act of treating the surface of the insulating film, a seed layer containing the halogen group and the predetermined element is formed on the surface of the insulating film.

(Supplementary Note 12)

In some embodiments, a thickness of the seed layer is 0.5 to 2 Å.

(Supplementary Note 13)

In some embodiments, the third precursor contains the predetermined element and an amino group.

(Supplementary Note 14)

In some embodiments, the third precursor contains the predetermined element and an amino group, and the thin film is composed of the predetermined element.

(Supplementary Note 15)

In some embodiments, the third precursor contains one amino group in a composition formula thereof (in one molecule).

(Supplementary Note 16)

In some embodiments, the third precursor includes at least one of a nitriding gas (nitrogen-containing gas), an oxidizing gas (oxygen-containing gas), a reducing gas (hydrogen-containing gas), a hydrocarbon-based gas (carbon-containing gas), a carbon and nitrogen-containing gas (amine-based gas, and organic hydrazine gas), and a boron-containing gas (halogenated boron-based gas, inorganic borazine-based gas, and organic borazine-based gas).

(Supplementary Note 17)

In some embodiments, the halogen group includes a chloro group or a fluoro group.

(Supplementary Note 18)

In some embodiments, the halogen group includes chlorine or fluorine.

(Supplementary Note 19)

In some embodiments, the predetermined element includes a semiconductor element or a metal element.

(Supplementary Note 20)

In some embodiments, the predetermined element includes silicon.

(Supplementary Note 21)

In some embodiments, the predetermined element includes silicon, and the thin film includes a silicon film.

(Supplementary Note 22)

In some embodiments, the insulating film includes at least one of an oxide film, a nitride film, and an oxynitride film.

(Supplementary Note 23)

According to another aspect of the present disclosure, there is provided a method of processing a substrate, including: treating a surface of an insulating film formed on a substrate by supplying a first precursor containing a predetermined element and a halogen group to the substrate; and forming a thin film containing the predetermined element on the treated surface of the insulating film by performing a cycle a predetermined number of times, the cycle including supplying a second precursor containing the predetermined element and a halogen group to the substrate and supplying a third precursor to the substrate.

(Supplementary Note 24)

According to still another aspect of the present disclosure, there is provided a substrate processing apparatus, including: a process chamber configured to accommodate a substrate; a first precursor supply system configured to supply a first precursor containing a predetermined element and a halogen group into the process chamber; a second precursor supply system configured to supply a second precursor containing the predetermined element and a halogen group into the process chamber; a third precursor supply system configured to supply a third precursor into the process chamber; and a control unit configured to control the first precursor supply system, the second precursor supply system, and the third precursor supply system so as to perform a process of supplying the first precursor to the substrate with an insulating film formed thereon in the process chamber to treat a surface of the insulating film, and a process of forming a thin film containing the predetermined element on the treated surface of the insulating film by performing a cycle a predetermined number of times, the cycle including supplying the second precursor to the substrate in the process chamber and supplying the third precursor to the substrate in the process chamber.

(Supplementary Note 25)

According to still another embodiment of the present disclosure, there is provided a program that causes a computer to perform a process of: supplying a first precursor containing a predetermined element and a halogen to a substrate with an insulating film formed thereon in a process chamber of a substrate processing apparatus to treat a surface of the insulating film; and forming a thin film containing the predetermined element on the treated surface of the insulating film by performing a cycle a predetermined number of times, the cycle including supplying a second precursor containing the predetermined element and a halogen group to the substrate in the process chamber and supplying a third precursor to the substrate.

(Supplementary Note 26)

According to still another embodiment of the present disclosure, there is provided a non-transitory computer-readable recording medium storing a program that causes a computer to perform a process of: supplying a first precursor containing a predetermined element and a halogen to a substrate with an insulating film formed thereon in a process chamber of a substrate processing apparatus to treat a surface of the insulating film; and forming a thin film containing the predetermined element on the treated surface of the insulating film by performing a cycle a predetermined number of times, the cycle including supplying a second precursor containing the predetermined element and a halogen group to the substrate in the process chamber and supplying a third precursor to the.

According to the present disclosure in some embodiments, it is possible to improve step coverage of a thin film, and productivity of the film forming process, when forming the thin film on a substrate with an insulating film formed on a surface.

While certain embodiments have been described, these embodiments have been presented by way of example only, and are not intended to limit the scope of the disclosures. Indeed, the novel methods and apparatuses described herein may be embodied in a variety of other forms; furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A method of manufacturing a semiconductor device, comprising:

treating a surface of an insulating film formed on a substrate by supplying a first precursor containing a predetermined element and a halogen group to the substrate; and forming a thin film containing the predetermined element on the treated surface of the insulating film by performing a cycle a predetermined number of times, the cycle comprising: supplying a second precursor containing the predetermined element and a halogen group to the substrate; and supplying a third precursor to the substrate, wherein in the act of treating the surface of the insulating film, a seed layer containing the halogen group is formed on the surface of the insulating film.

2. The method of claim 1, wherein a supply time of the first precursor is set to be longer than a supply time of the second precursor per the cycle.

3. The method of claim 1, wherein a flow rate of the first precursor is set to be greater than a flow rate of the second precursor.

4. The method of claim 1, wherein a pressure of a space where the substrate exists when supplying the first precursor is set to be higher than a pressure of a space where the substrate exists when supplying the second precursor.

5. The method of claim 1, wherein in the act of treating the surface of the insulating film, a seed layer is formed on the surface of the insulating film.

6. The method of claim 1, wherein in the act of treating the surface of the insulating film, a seed layer containing the halogen group and the predetermined element is formed on the surface of the insulating film.

7. The method of claim 1, wherein the third precursor includes at least one of a nitrogen-containing gas, an oxygen-containing gas, a hydrogen-containing gas, a carbon-containing gas, a carbon and nitrogen-containing gas, and a boron-containing gas.

8. The method of claim 1, wherein the halogen group includes a chloro group or a fluoro group.

9. The method of claim 1, wherein the insulating film includes at least one of an oxide film, a nitride film, and an oxynitride film.

10. The method of claim 1, wherein the predetermined element includes a semiconductor element or a metal element.

11. A method of manufacturing a semiconductor device, comprising:

treating a surface of an insulating film formed on a substrate by supplying a first precursor containing a predetermined element and a halogen group to the substrate; and forming a thin film containing the predetermined element on the treated surface of the insulating film by performing a cycle a predetermined number of times, the cycle comprising: supplying a second precursor containing the predetermined element and a halogen group to the substrate; and supplying a third precursor to the substrate, wherein the first precursor and the second precursor comprises the same substance.

12. A method of manufacturing a semiconductor device, comprising:

treating a surface of an insulating film formed on a substrate by supplying a first precursor containing a predetermined element and a halogen group to the substrate; and forming a thin film containing the predetermined element on the treated surface of the insulating film by performing a cycle a predetermined number of times, the cycle comprising: supplying a second precursor containing the predetermined element and a halogen group to the substrate; and supplying a third precursor to the substrate, wherein in the act of treating the surface of the insulating film, a seed layer is formed on the surface of the insulating film, and wherein a thickness of the seed layer is 0.5 to 2 Å.

13. A method of manufacturing a semiconductor device, comprising:
- treating a surface of an insulating film formed on a substrate by supplying a first precursor containing a predetermined element and a halogen group to the substrate; and
- forming a thin film containing the predetermined element on the treated surface of the insulating film by performing a cycle a predetermined number of times, the cycle comprising: supplying a second precursor containing the predetermined element and a halogen group to the substrate; and supplying a third precursor to the substrate,
- wherein the third precursor contains the predetermined element and an amino group.

14. The method of claim 13,
- wherein the thin film is composed of the predetermined element.

15. A method of manufacturing a semiconductor device, comprising:
- treating a surface of an insulating film formed on a substrate by supplying a first precursor containing a predetermined element and a halogen group to the substrate; and
- forming a thin film containing the predetermined element on the treated surface of the insulating film by performing a cycle a predetermined number of times, the cycle comprising: supplying a second precursor containing the predetermined element and a halogen group to the substrate; and supplying a third precursor to the substrate,
- wherein the third precursor contains one amino group in one molecule.

16. A non-transitory computer-readable recording medium storing a program that causes a computer to perform a process of:
- treating a surface of an insulating film formed on a substrate by supplying a first precursor containing a predetermined element and a halogen group to the substrate in a process chamber; and
- forming a thin film containing the predetermined element on the treated surface of the insulating film by performing a cycle a predetermined number of times, the cycle comprising: supplying a second precursor containing the predetermined element and a halogen group to the substrate in the process chamber; and supplying a third precursor to the substrate in the process chamber,
- wherein in the act of treating the surface of the insulating film, a seed layer containing the halogen group is formed on the surface of the insulating film.

* * * * *